(12) United States Patent
Liu et al.

(10) Patent No.: US 9,850,593 B2
(45) Date of Patent: *Dec. 26, 2017

(54) METHOD OF MAKING QUANTUM DOTS

(71) Applicant: SAMSUNG ELECTRONICS CO., LTD, Suwon-si (KR)

(72) Inventors: Wenhao Liu, Billerica, MA (US); Craig Breen, Somerville, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/284,292

(22) Filed: May 21, 2014

(65) Prior Publication Data

US 2015/0014586 A1  Jan. 15, 2015

Related U.S. Application Data

(63) Continuation of application No. PCT/US2012/066147, filed on Nov. 20, 2012.

(60) Provisional application No. 61/562,465, filed on Nov. 22, 2011, provisional application No. 61/678,896, filed on Aug. 2, 2012.

(51) Int. Cl.
| | |
|---|---|
| *C09K 11/88* | (2006.01) |
| *C09K 11/56* | (2006.01) |
| *C09K 11/02* | (2006.01) |
| *C30B 29/48* | (2006.01) |
| *C30B 7/14* | (2006.01) |
| *H01L 21/02* | (2006.01) |
| *B22F 1/00* | (2006.01) |
| *B22F 1/02* | (2006.01) |
| *B22F 9/24* | (2006.01) |
| *C22C 1/10* | (2006.01) |
| *C22C 20/00* | (2006.01) |
| *B82Y 30/00* | (2011.01) |
| *C30B 7/00* | (2006.01) |
| *C30B 7/08* | (2006.01) |
| *C30B 19/12* | (2006.01) |
| *C30B 29/68* | (2006.01) |
| *H01L 33/28* | (2010.01) |
| *B82Y 40/00* | (2011.01) |
| *B82Y 20/00* | (2011.01) |

(52) U.S. Cl.
CPC .............. *C30B 7/14* (2013.01); *B22F 1/0018* (2013.01); *B22F 1/025* (2013.01); *B22F 9/24* (2013.01); *B82Y 30/00* (2013.01); *C22C 1/1026* (2013.01); *C22C 20/00* (2013.01); *C30B 7/005* (2013.01); *C30B 7/08* (2013.01); *C30B 19/12* (2013.01); *C30B 29/48* (2013.01); *C30B 29/68* (2013.01); *H01L 21/0256* (2013.01); *H01L 21/02557* (2013.01); *H01L 21/02601* (2013.01); *H01L 21/02628* (2013.01); *H01L 33/28* (2013.01); *B82Y 20/00* (2013.01); *B82Y 40/00* (2013.01); *Y10S 977/774* (2013.01); *Y10S 977/892* (2013.01); *Y10S 977/896* (2013.01); *Y10S 977/95* (2013.01)

(58) Field of Classification Search
CPC ..... C09K 11/883; C09K 11/565; C09K 11/02; C09K 11/70; C09K 11/881; C09K 11/54; C09K 11/88; C09K 11/892; C09K 11/0811; C09K 11/595; C09K 11/612; C09K 11/621; C09K 11/703; C09K 11/7414; C30B 29/48; C30B 29/50; C30B 29/68; C30B 29/46; C30B 7/00; C30B 7/14; C30B 7/005; C30B 7/08; C30B 19/12; C01P 2004/64; C01P 2004/80; B82Y 40/00; B82Y 20/00; H01L 21/02601; H01L 21/02557; H01L 21/0256; H01L 21/02568; H01L 21/02392; H01L 21/024; H01L 21/02406; H01L 21/02409; H01L 21/02469; H01L 21/02474; H01L 21/02477; H01L 33/28; H01L 33/0029; H01L 29/18; H01L 31/0272; B01J 27/0573; B01J 27/0576; B01J 27/04; B01J 23/06; C01B 19/007; C01B 19/04

USPC ....... 252/301.6 S, 301.4 R, 301.6 R, 301.4 P, 252/301.6 P; 977/773, 824, 840, 900; 428/403, 402; 423/509, 566.1, 508, 511; 117/54, 68, 956

See application file for complete search history.

(56) References Cited

U.S. PATENT DOCUMENTS

| | | |
|---|---|---|
| 3,760,000 A | 9/1973 | Curry |
| 6,322,901 B1 | 11/2001 | Bawendi et al. |
| 6,607,829 B1 | 8/2003 | Bawendi et al. |
| 6,815,064 B2 | 11/2004 | Treadway et al. |
| 6,872,249 B2 | 3/2005 | Peng et al. |
| 7,147,712 B2 | 12/2006 | Zehnder et al. |
| 7,229,497 B2 * | 6/2007 | Stott ................... C30B 7/14  117/11 |
| 7,265,037 B2 | 9/2007 | Yang et al. |

(Continued)

FOREIGN PATENT DOCUMENTS

| | | | |
|---|---|---|---|
| WO | 2009035657 A1 | 3/2009 | |
| WO | WO 2009120688 A1 * | 10/2009 | ............. B82Y 30/00 |

OTHER PUBLICATIONS

Aharoni et al., "Synthesis of InAs/CdSe/ZnSe Core/Shell1/SHell2 Structures with bright and stable Near-Infrared Flourescence"; J. AM. Chem. Soc.; 2006; 128; 257-264.

(Continued)

*Primary Examiner* — Matthew E Hoban
*Assistant Examiner* — Lynne Edmondson
(74) *Attorney, Agent, or Firm* — Cantor Colburn LLP

(57) ABSTRACT

Quantum dots and methods of making quantum dots are provided.

16 Claims, 4 Drawing Sheets

(56) References Cited

U.S. PATENT DOCUMENTS

| | | | |
|---|---|---|---|
| 7,267,810 B2 | 9/2007 | Yu et al. | |
| 7,306,823 B2 | 12/2007 | Sager et al. | |
| 7,476,599 B2 | 1/2009 | Wang et al. | |
| 7,482,059 B2 | 1/2009 | Peng et al. | |
| 7,545,051 B2 | 6/2009 | Yang et al. | |
| 7,767,260 B2 | 8/2010 | Peng et al. | |
| 7,824,731 B2 | 11/2010 | Ying et al. | |
| 7,919,012 B2 | 4/2011 | Peng et al. | |
| 8,134,175 B2 | 3/2012 | Bawendi et al. | |
| 8,377,333 B2 | 2/2013 | Ramprasad et al. | |
| 8,404,154 B2 | 3/2013 | Breen et al. | |
| 8,691,114 B2 | 4/2014 | Ramprasad et al. | |
| 8,906,265 B2 | 12/2014 | Breen et al. | |
| 8,980,133 B2 * | 3/2015 | Ramprasad | C09K 11/565 252/301.4 R |
| 9,054,329 B2 | 6/2015 | Coe-Sullivan et al. | |
| 9,136,428 B2 * | 9/2015 | Clough | B82Y 30/00 |
| 9,139,435 B2 * | 9/2015 | Breen | B82Y 30/00 |
| 2002/0106849 A1 | 8/2002 | Moore | |
| 2003/0145779 A1 | 8/2003 | Alivisatos et al. | |
| 2003/0227116 A1 | 12/2003 | Halik et al. | |
| 2004/0178390 A1 | 9/2004 | Whiteford et al. | |
| 2006/0103589 A1 | 5/2006 | Chua et al. | |
| 2007/0059527 A1 | 3/2007 | Jun et al. | |
| 2007/0104865 A1 | 5/2007 | Pickett | |
| 2007/0201056 A1 | 8/2007 | Cok et al. | |
| 2007/0289491 A1 | 12/2007 | Peng et al. | |
| 2008/0012031 A1 | 1/2008 | Jang et al. | |
| 2008/0084706 A1 | 4/2008 | Roshan et al. | |
| 2008/0118755 A1 | 5/2008 | Whiteford et al. | |
| 2008/0220593 A1 * | 9/2008 | Pickett | B82Y 30/00 438/478 |
| 2008/0252209 A1 | 10/2008 | Jang et al. | |
| 2008/0264473 A1 | 10/2008 | Cumpston et al. | |
| 2008/0268248 A1 | 10/2008 | Jang et al. | |
| 2008/0296144 A1 | 12/2008 | Strouse et al. | |
| 2009/0152664 A1 | 6/2009 | Klem et al. | |
| 2009/0162011 A1 | 6/2009 | Coe-Sullivan et al. | |
| 2009/0203196 A1 | 8/2009 | Kim et al. | |
| 2009/0217970 A1 | 9/2009 | Zimmerman et al. | |
| 2009/0230382 A1 | 9/2009 | Banin et al. | |
| 2010/0009338 A1 | 1/2010 | Zhang et al. | |
| 2010/0051901 A1 | 3/2010 | Kazlas et al. | |
| 2010/0052512 A1 | 3/2010 | Clough et al. | |
| 2010/0062154 A1 | 3/2010 | Shin et al. | |
| 2010/0108530 A1 | 5/2010 | Zehnder et al. | |
| 2010/0123155 A1 | 5/2010 | Pickett et al. | |
| 2010/0140586 A1 | 6/2010 | Char et al. | |
| 2010/0226849 A1 | 9/2010 | Peng | |
| 2010/0265307 A1 | 10/2010 | Linton et al. | |
| 2010/0283014 A1 | 11/2010 | Breen et al. | |
| 2010/0283072 A1 | 11/2010 | Kazlas et al. | |
| 2010/0289003 A1 | 11/2010 | Kahen et al. | |
| 2010/0289044 A1 | 11/2010 | Krames et al. | |
| 2011/0052918 A1 | 3/2011 | Krauss et al. | |
| 2011/0081538 A1 | 4/2011 | Linton | |
| 2011/0103064 A1 | 5/2011 | Coe-Sullivan et al. | |
| 2011/0175030 A1 | 7/2011 | Ren et al. | |
| 2011/0186811 A1 | 8/2011 | Coe-Sullivan et al. | |
| 2011/0220194 A1 | 9/2011 | Kurtin et al. | |
| 2011/0220844 A1 | 9/2011 | Tulsky et al. | |
| 2011/0226991 A1 | 9/2011 | Treadway et al. | |
| 2011/0229397 A1 * | 9/2011 | Bartel | B01J 19/243 423/299 |
| 2011/0240922 A1 * | 10/2011 | Jun | C09K 11/02 252/301.36 |
| 2011/0245533 A1 | 10/2011 | Breen et al. | |
| 2011/0260111 A1 | 10/2011 | Nie et al. | |
| 2011/0262752 A1 | 10/2011 | Bawendi et al. | |
| 2011/0309238 A1 | 12/2011 | Tian et al. | |
| 2011/0315927 A1 * | 12/2011 | Tulsky | B22F 1/02 252/301.6 R |
| 2012/0113671 A1 | 5/2012 | Sadasivan et al. | |
| 2012/0187367 A1 | 7/2012 | Modi et al. | |
| 2012/0189791 A1 | 7/2012 | Modi et al. | |
| 2012/0250351 A1 | 10/2012 | Shin et al. | |
| 2012/0256141 A1 | 10/2012 | Nick et al. | |
| 2012/0286238 A1 | 11/2012 | Linton et al. | |
| 2012/0313075 A1 | 12/2012 | Linton et al. | |
| 2013/0069018 A1 | 3/2013 | Zhu et al. | |
| 2013/0175514 A1 | 7/2013 | Han et al. | |
| 2013/0193407 A1 | 8/2013 | Clough et al. | |
| 2014/0049155 A1 | 2/2014 | Kurtin | |
| 2014/0198142 A1 | 7/2014 | Whitehead et al. | |
| 2014/0227862 A1 | 8/2014 | Song et al. | |
| 2014/0312300 A1 | 10/2014 | Ramprasad et al. | |
| 2014/0322901 A1 | 10/2014 | Huang et al. | |
| 2014/0334181 A1 | 11/2014 | Hu et al. | |
| 2015/0003043 A1 | 1/2015 | Ke | |
| 2015/0013589 A1 | 1/2015 | Liu et al. | |
| 2015/0014586 A1 | 1/2015 | Liu et al. | |
| 2015/0014629 A1 | 1/2015 | Breen et al. | |
| 2015/0021548 A1 | 1/2015 | Liu et al. | |
| 2015/0021551 A1 | 1/2015 | Breen et al. | |
| 2015/0166341 A1 | 6/2015 | Hamilton et al. | |
| 2015/0171268 A1 | 6/2015 | Breen et al. | |
| 2015/0184074 A1 | 7/2015 | Breen et al. | |
| 2015/0191617 A1 | 7/2015 | Linton et al. | |

OTHER PUBLICATIONS

Bala et al., "Interaction of Different Metal Ions with Carboxylic Acid Group: A Quantative Study"; J. Phys/ Chem. A; 2007; 111; 6183-6190.

Cumberland et al., "Inorganic Clusters as Single-Source Presursors for Preparation of CdSe, ZnSe, and CdSe/ZnS Nanomaterials"; Chem. Mater.; 2002; 14; 1576-1584.

Dabbousi et al., "(CdSe)AnS Core-Shell Quantum Dots: Synthesis and Characterization of a Size Series of Highly Luminescent Nanocrystallites"; J. Phys. Chem. B.; 1997; 101; 9463-9475.

De Mello et al., "An Improved Experimental Determination of External Photoluminescence Quantum Efficiency"; Adv. Mater.; 1997; 9; No. 5; 230-232.

Donega et al., "Physicochemical Evaluation of the Hot-Injection Method, a Synthesis Route for Monodisperse Nanocrystals"; Small; 2005; 1; No. 12; 1152-1162.

Dukes, III et al., "Luminescent Quantum Dots"; ECS Transactions; 2011; 33 (33); 3-16.

Evans et al., "Mysteries of TOPSe Revealed: Insight into Quantum Dot Nucleation"; J. Am. Chem. Soc.; 2010 (3 pages).

Evans et al., Supporting Documents for: "Mysteries of TOPSe Revealed: Insights into Quantum Dot Nucleation" (21 pages).

Gomes et al., "Binding of Phosphonic Acids to CdSe Quantum Dots: A Solution NMR Study"; J. Phys. Chem. Lett.; 2011; 2; 145-152.

Gong, "Synthesis, optical properties, and surface modification of magic-size semiconductor nanocrystals, nanowires and nanoplatelets"; San Diego State University 2011(http://sdsu-dspace.calstate.edu/handle/10211.10/1438); 49 pages.

International Preliminary Report on Patentability; International Application No. PCT/US2012/066147; International Filing Date Nov.20, 2012; dated May, 27, 2014, 5 pages.

International Search Report; International Application No. PCT/US2012/066147; International Filing Date Nov.20, 2012; dated Jan. 31, 2013, 3 pages.

Jang et al., "High quality CdSeS nanocrystals synthesized by facile single injection process and their electroluminescence"; ChemComm; 2003; 2964-2965.

Jing et al., "Temperature-Dependent Photoluminescence of CdSe-Core CdS/CdZnS/ZnS-Multishell Quantum Dots"; J. Phys. Chem. C.; 2009; 113; 13545-13550.

Koole et al., "Paramagnetic lipid-coated silica nanoparticles with a fluorescent quantum dot core: a new contrast agent platform for multimodality imaging"; Bioconj. Chem.; 2008; 19(12); 2471-2479.

Kopping et al., "Identification of Acidic Phosphorus-Containing Ligands Involved in the Surface Chemistry of CdSe Nanoparticles Prepared in Tri-N-octylphosphine Oxide Solvents"; J. Am. Chem. Soc. 2008; 130; 5689-5698.

(56) References Cited

OTHER PUBLICATIONS

Kopping et al., Supporting Documents for: "Identification of Acidic Phosphorous-Containing Ligands Involved in the Surface Chemistry of CdSe Nanoparticles Prepared in Tri-n-Octylphosphine Oxide (TOPO) Solvents" (5 pages).

Kortan et al., "Nucleation and Growth of CdSe on ZnS Quantum Crystallite Seeds, and Vice Versa, in Inverse Micelle Media"; J. Am. Chem. Soc.; 1990; vol. 112 No. 4; 1327-1332.

Led's Magazine "Quantum dots begin to impact backlight and general illumination application"; ledsmagazine.com/news/7/2/12 (3 pages).

Murray et al., "Synthesis and Characterization of Monodisperse Nanocrystals and Close-Packed Nanocrystal Assemblies"; Annu. Rev. Mater. Sci.; 2000; 30; 545-610.

Murray et al., "Synthesis and Characterization of Nearly Monodisperse CdE (E=S, Se, Te) Semiconductor Nanocrystallites"; J. Am. Chem. Soc.; 1993; 115; 8706-8715.

Murray, "Synthesis and Characterization of II-VI Quantum Dots and Their Assembly into 3D Quantum Dot Superlattices"; Thesis; Massachusetts Institute of Technology; 1995 (166 pages).

Owen et al., "Precursor Conversion Kinetics and the Nucleation of Cadmium Selenide Nanocrystals"; J. Am. Chem. Soc.; 2010; 132; 18206-18213.

Owen et al., Supporting Documents for: "Precursor conversion kinetics and the nucleation of cadmium selenide nanocrystals" (13 pages).

Peng et al., "Kinetics of II-VI and III-V Colloidal Semiconductor Nanocrystal Growth: "Focusing" of Size Distributions"; J. Am. Chem. Soc.; 1998; 120; 5343-5344.

Peng et al., "Mechanisms of the Shape Evolution of CdSe Nanocrystals"; J. Am. Chem. Soc.; 2001; 123; 1389-1395.

Puzder et al., "The Effect of Organic Ligand Binding on the Growth CdSe Nanoparticles Probed by Ab-Initio Calculations"; Nanoletters; 2004; 1-6.

Reiss et al., "The Growth of Uniform Colloidal Dispersion"; Journal of Chamical Physics; 1951; vol. 19; No. 4; 182-487.

Schreuder et al., "Control of Surface State Emission via Phosphonic Acid Modulation in Ultrasmall CdSe Nanocrystals: The Role of Ligand Electronegativity"; J. Phys. Chem. C.; 2009; 113; 8169-8176.

Shen et al., "One-Step Synthesis of White-Light-Emitting Quantum Dots at Low Temperature"; Inorg. Chem.; 2009; 48; 8689-8694.

Shweky et al., "Seeded growth of InP and InAs quantum rods using indium acetate and myristic acid"; Materials Science and Engineering C; 2006; 26; 788-794.

Van Embden et al., "Nucleation and Growth of CdSe Nanocrystals in Binary Ligand System"; Langmuir; 2005; 21; 10226-10233.

Wang et al., "Morphology Control of Cadmium Selenide Nanocrystals: Insights into the Roles of Di-n-octylphosphine Oxide (DOPO) and Di-n-octylphosphinic Acid (DOPA)"; J. Am. Chem. Soc.; 2012; 134; 5369-5380.

Wang et al., "Spectroscopic Identification of Tri-n-octylphosphine Oxide (TOPO) Impurities and Elucidation of Their Roles in Cadmium Selenide Quantum-Wire Growth"; J. Am. Chem. Soc.; 2009; 131; 4983-4994.

Wang et al., "The Trouble with TOPO; Identification of Adventitious Impurities Beneficial to the Growth of Cadmium Selenide Quantum Dots, Rods, and Wires"; Nano Letters; 2008.

Wang et al., Supporting Documents for: "Morphology Control of Cadmiun Selenide Nanocrystals: Insight into the Roles of Di-n-octylphosphine Oxide (DOPO) and Di-n-octylphosphinic Acid (DOPA)" (37 pages).

Wang et al., Supporting Documents for: "Spectroscopic Identification of Tri-n-octylphosphine Oxide (TOPO) Impurities and Elucidation of Their Roles in Cadmium Selenide Quantum-Wire Growth" (49 pages).

Wang et al., Supporting Documents for: The Trouble with TOPO; Identification of Adventitious Impurities Beneficial to the Growth of Cadmium Selenide Quantum Dots, Rods and Wires (7 pages).

Wolcott et al., "CdSe Quantum Rod Formation Aided by In Situ TOPO Oxidation"; Chem. Mater.; 2010; 22; 2814-2821.

Wolcott et al., Supporting Documents for: "CdSe Quantum Rod Formation Aided by In Situ TOPO Qxidation" (10 pages).

Writte Opinion of the International Searching Authority; International Application No. PCT/US2012/66147; International Filing Date Nov. 2012; dated Jan. 31, 2013; 4 pages.

Xie et al., "Synthesis and Characterization of Highly Luminescent CdSe-Core CdS/Zn0.5Cd0.5S/ZnS Multishell Nanocrystals"; J. Am. Chem. Soc.; 2005; 127; 7480-7488.

* cited by examiner

Absorption spectrum of the core material
(448 nm peak, 16 nm HWHM)

Absorption and emission spectrum of ggCdSeCS-121
(Emission Peak: 531 nm; FWHM 41 nm)

Absorption spectrum of the core material
(576 nm peak, 12 nm HWHM)

Absorption and emission spectrum of grCdSeCS-145
(Emission Peak: 617 nm; FWHM 28 nm)

METHOD OF MAKING QUANTUM DOTS

This application is a continuation of International Application No. PCT/US2012/066147, filed 20 Nov. 2012, which was published in the English language as International Publication No. WO 2013/078249 on 30 May 2013, which International Application claims priority to U.S. Provisional Patent Application No. 61/562,465, filed on 22 Nov. 2011 and U.S. Provisional Patent Application No. 61/678,896, filed on 2 Aug. 2012. Each of the foregoing is hereby incorporated herein by reference in its entirety for all purposes.

TECHNICAL FIELD OF THE INVENTION

The present invention relates to the field of nanotechnology and more particularly to a method for preparing semiconductor nanocrystals.

BRIEF SUMMARY OF THE INVENTION

Embodiments of the present invention are directed to methods of making quantum dots (also referred to herein as semiconductor nanocrystals.) Quantum dots of certain size can be made according to a reaction process described herein which is terminated or quenched before Ostwald ripening or broadening of the size distribution of the semiconductor particles occurs, preferably the reaction process is terminated or quenched immediately after nucleation. The quantum dots or core particles so formed may be further reacted with precursors to grow the quantum dots to a certain size. According to one embodiment, the quantum dots may be further grown to a desired wavelength under suitable conditions without first isolating the quantum dots or core particles from the reaction media. According to one embodiment, the quantum dots may be isolated from media and then subjected to conditions to facilitate further growth of the particles to a desired wavelength thereby producing quantum dots. According to an additional embodiment, the quantum dots are produced by separate nucleation and growth steps. According to an additional embodiment, the quantum dots are produced by a separate nucleation step where substantially all precursors are consumed in the reaction to create the quantum dots or core particles. According to one aspect, a seed stabilizing agent may be included in the reaction media. The seed stabilizing agent prevents or inhibits Ostwald ripening of quantum dots.

According to a still additional embodiment, the quantum dots are produced by a separate growth step where substantially all precursors are consumed in the reaction to create the quantum dots.

Accordingly, the present invention provides a quantitative nucleation process followed by a quantitative growth process to produce quantum dots of any desired size and where the quantum dots need not be isolated or purified prior to a subsequent coating process. According to a still additional embodiment, the separate nucleation and growth steps are carried out in a single reaction vessel. According to a still further embodiment, the quantum dots produced by the methods of the present invention may further be provided with a coating or shell or layer. According to an additional embodiment, the quantum dots produced by the methods described herein by separate nucleation and growth steps need not be purified prior to being provided with a coating or layer or shell. According to an additional embodiment, the quantum dots produced by the methods described herein by separate nucleation and growth steps are created using a quantitative method where precursors or reactants are substantially consumed or reacted to form the quantum dots and the resulting quantum dots need not be purified prior to being provided with a coating or layer or shell. According to a still further aspect, the quantum dots may be nucleated, grown and coated in a single reaction vessel and without isolation or purification of quantum dots at any particular stage of the nucleation, growth or coating of the quantum dots.

According to certain aspects of the present disclosure, core quantum dots may be formed from quantum dot precursors. For example, quantum dots comprising a semiconductor material that can be represented by the formula MX, wherein M represents one or more metals and X represents one or more chalcogens and/or one or more pnictogens, can be formed from quantum dot precursors comprising one or more M donors and one or more X donors. Quantum dot precursors preferably comprise highly reactive precursors that will react with each other substantially immediately under the reaction conditions to form nuclei of the predetermined semiconductor material. M donors according to the present invention may be highly reactive precursors or precursors with a low reactivity as desired. X donors according to the present invention may be highly reactive precursors or precursors with a low reactivity as desired. Highly reactive precursors and reactive precursors with low reactivity whether M donors or X donors are readily known to those of skill in the art. According to one aspect, a highly reactive M donor and a highly reactive X donor can be used to create the quantum dots of the present invention.

According to certain aspects an X donor is added to a solution of a metal source or M donor at a reaction temperature to form a reaction mixture. According to one aspect, a seed stabilizing agent may be included in the reaction media. The seed stabilizing agent prevents or inhibits Ostwald ripening of quantum dots. The reaction is then terminated or quenched. Preferably, the growth process is quenched by lowering the temperature to stop nucleation and Ostwald ripening. According to one aspect, the reaction is terminated or quenched so as to stop growth of the quantum dots before the quantum dots ripen or broaden or combine together. According to one aspect, the reaction is terminated or quenched by cooling the reaction mixture to a quenching temperature effective to terminate or quench the nucleation process in a manner to stop or limit further growth of the semiconductor nanocrystals. According to an additional aspect, the reaction mixture is cooled to a temperature effective to quench or stop growth of the semiconductor nanocrystals formed in the reaction mixture prior to ripening or broadening or combining of the quantum dots. Quantum dots are present in the reaction vessel and may be isolated or recovered. Preferably the quantum dots remain in the reaction vessel and media for further growth under suitable conditions.

The quantum dots in the reaction vessel or the quantum dots after isolation or recovery may be subjected to further growth by exposure to an M donor and an X donor. M donors according to the present invention may be highly reactive precursors or precursors with a low reactivity as desired. X donors according to the present invention may be highly reactive precursors or precursors with a low reactivity as desired. Highly reactive precursors and reactive precursors with low reactivity whether M donors or X donors are readily known to those of skill in the art. According to one aspect, a highly reactive M donor and a highly reactive X donor can be used to create the quantum dots of the present invention. According to this aspect, the quantum dots are exposed to an M donor and an X donor under suitable reaction conditions such that the quantum dots grow in size using the M donor and X donor. According to one aspect, the M donor and the X donor are provided to a reaction vessel including the quantum dots as a substantially steady or substantially constant infusion or feed or source such that as the M donor and the X donor are consumed or otherwise used to grow the quantum dots, additional supply of M donor and X donor are provided to the reaction vessel, such as in a substantially continuous manner, to continue growth of the quantum dots until a desired quantum dot size is reached.

According to a certain aspect, a solution of an M donor is provided at a reaction temperature, such as by heating, after which an X donor is rapidly added to the solution of the metal source whereupon nanocrystals including the M component of the M donor and the X component of the X donor form in a reaction mixture. The reaction is terminated resulting in nanocrystals of certain size. According to one aspect, the reaction is terminated according to methods known to those of skill in the art which may include termination by use of a chemical agent, termination by use of a temperature reduction such as by injection of a fluid having a temperature lower than the reaction temperature thereby lowering the temperature of the media to a quenching temperature, termination by use of isolation material or dilution of reactive ingredients to a point where the reactive ingredients are no longer effectively reactive. According to one aspect, the reaction is terminated by rapidly cooling the reaction mixture to a quenching temperature where the reaction substantially terminates and further growth of the quantum dots is substantially prevented. Such a quenching temperature can be determined by those of skill in the art and is selected to prevent Ostwald ripening of the quantum dots. It is to be understood that different reaction temperatures may exist for different reaction mixtures. Likewise, it is to be understood that different quenching temperatures may exist for different reaction mixtures. Accordingly, reaction temperatures include those at which quantum dots may be created and quenching temperatures include those at which the growth of quantum dots is terminated or quenched substantially before Ostwald ripening thereby resulting in quantum dots of desired size. Quantum dots are present in the reaction vessel and may be isolated or recovered. Preferably the quantum dots remain in the reaction vessel and media for further growth under suitable conditions.

According to one aspect, M donors and X donors are provided to a reaction vessel including the quantum dots as a substantially steady or substantially constant infusion or feed or source such that as M donor and X donor are consumed or otherwise used to grow the quantum dots, additional supply of M donor and X donor are provided to the reaction vessel, such as in a substantially continuous manner, to continue growth of the quantum dots until a desired quantum dot size is reached.

According to a certain preferred aspect, a solution of an M donor and a seed stabilizing agent is provided at a reaction temperature, such as by heating, after which an X donor is rapidly added, such as by injection, into the solution of the metal source to form a reaction mixture whereupon the M component from the M donor and the X component from the X donor combine into nanocrystals which then increase in size or grow by further combination of the M component and the X component present in the reaction mixture. Immediately after addition of the X donor is completed, the reaction mixture is rapidly cooled to a quenching temperature by addition of a fluid which has a temperature lower than the reaction temperature thereby lowering the reaction media to a quenching temperature and terminating or quenching the growth of nanocrystals. According to one aspect, the precursors are provided in quantitative or stoichiometric amounts such that substantially no unreacted precursors are present in the reaction media when quantum dot growth is terminated. According to certain aspects, the reaction, i.e. growth of nanocrystals, is terminated thereby resulting in nanocrystals of certain size by quenching methods known to those of skill in the art. Quantum dots are present in the reaction vessel and may be isolated or recovered. Preferably the quantum dots remain in the reaction vessel and media for further growth under suitable conditions.

According to one aspect, substantially no unreacted precursors are present in the reaction media.

According to one aspect, M donors and X donors are provided to a reaction vessel including the quantum dots as a substantially steady or substantially constant infusion or feed or source such that as M donor and X donor are consumed or otherwise used to grow the quantum dots, additional supply of M donor and X donor are provided to the reaction vessel, such as in a substantially continuous manner, to continue growth of the quantum dots until a desired quantum dot size is reached. According to one aspect, the precursors are provided in quantitative or stoichiometric amounts such that substantially no unreacted precursors are present in the reaction media once a quantum dot of desired size is obtained.

According to a certain aspect, quantum dots of certain desired size are created by selecting a certain initial reaction temperature of a solution of an M donor, preferably also including a seed stabilizing agent, followed by rapid addition, such as by injection, of an X donor to produce a reaction mixture. Immediately after completion of the rapid addition of the X donor, the reaction mixture is rapidly cooled to a quenching temperature to stop or otherwise inhibit further nanocrystal growth. According to this aspect, a higher initial reaction temperature will produce quantum dots of larger diameter compared to a lower initial reaction temperature. In this manner, a method is provided of tuning quantum dot size by selecting an initial reaction temperature which is rapidly lowered to a quenching temperature. Without wishing to be bound by scientific theory, the higher the initial reaction temperature, the longer the reaction mixture is allowed to react, and accordingly, the longer the particles are allowed to grow before reaching a temperature at which the reaction is substantially or effectively terminated. Once the reaction is terminated, the quantum dots produced may then be contacted with M donors and X donors provided to a reaction vessel including the quantum dots as a substantially steady or substantially constant infusion or feed or source such that as M donor and X donor are consumed or otherwise used to grow the quantum dots, additional supply of M donor and X donor are provided to the reaction vessel, such as in a substantially continuous manner, to continue growth of the quantum dots until a desired quantum dot size is reached.

According to certain aspects of the present disclosure, a highly reactive chalcogenide precursor such as a secondary phosphine chalcogenide or secondary phosphine chalcogenide precursor or oxygen-treated tertiary phosphine is added to a solution of a highly reactive metal source at a reaction temperature to form a reaction mixture. The reaction mixture may contain a seed stabilizing agent such as a phosphonic acid. In certain embodiments, the secondary phosphine chalcogenide precursor comprises at least 10% secondary phosphine chalcogenide by weight, e.g., at least 20% secondary phosphine chalcogenide by weight, at least 30% secondary phosphine chalcogenide by weight, at least 40% secondary phosphine chalcogenide by weight, at least 50% secondary phosphine chalcogenide by weight, at least 60% secondary phosphine chalcogenide by weight, at least 70% secondary phosphine chalcogenide by weight, at least 80% secondary phosphine chalcogenide by weight, at least 90% secondary phosphine chalcogenide by weight, up to 100% secondary phosphine chalcogenide by weight. The reaction is then terminated or quenched. According to one aspect, the reaction is terminated or quenched so as to stop growth of the quantum dots before the quantum dots Ostwald ripen or the size distribution broadens or the quantum dots combine together in an undesirable manner. According to one aspect, termination of the reaction comprises cooling the reaction mixture to a quenching temperature effective to terminate or quench the reaction process in a manner to stop or limit further growth of the semiconductor nanocrystals. In an additional aspect, the reaction mixture is cooled to a temperature effective to quench or stop growth of the semiconductor nanocrystals formed in the reaction mixture prior to Ostwald ripening which results in particle size distribution broadening. Quantum dots are present in the reaction vessel and may be isolated or recovered or remain in the reaction vessel and media for further growth under suitable conditions.

The quantum dots in the reaction vessel formed via nucleation followed by rapid quench, or the quantum dots after isolation or recovery may be subjected to further growth by exposure to a highly reactive metal precursor and highly reactive chalcogenide precursor such as a secondary phosphine chalcogenide or secondary phosphine chalcogenide precursor or oxygen-treated tertiary phosphine, preferably at a temperature that is high enough for growth, but low enough such that Ostwald ripening does not occur. According to this aspect, the quantum dots are exposed to metal and chalcogenide precursors under suitable reaction conditions such that the size of the quantum dots grow by reaction of the metal and chalcogenide on the quantum dots. According to one aspect, metal and chalcogenide precursors or reactants are provided to a reaction vessel including the quantum dots as a substantially steady or substantially constant infusion or feed or source such that as metal and chalcogenide precursors are consumed or otherwise used to grow the quantum dots, additional supply of metal and chalcogenide precursors are provided to the reaction vessel, such as in a substantially continuous manner, to continue growth of the quantum dots until a desired quantum dot size is reached. According to one aspect, the precursors are provided in quantitative or stoichiometric amounts such that substantially no unreacted precursors are present in the reaction media once a quantum dot of desired size is obtained.

In the present invention described herein, an oxygen-treated tertiary phosphine chalcogenide can comprise liquid tertiary phosphine chalcogenide that is exposed to air or other gas including oxygen. Exposure can include, for example, bubbling air or other oxygen containing gas into the liquid tertiary phosphine chalcogenide, flowing air or other oxygen containing gas over the surface of the liquid, or other techniques readily ascertained by the skilled artisan. Preferably, the air or other gas including oxygen to which the liquid tertiary phosphine chalcogenide is exposed is dry. In certain embodiments, such exposure is carried out at room temperature, e.g., without the application of heat. The addition of air or other gas including oxygen is carried out to convert at least a portion of the tertiary phosphine chalcogenide to a secondary phosphine chalcogenide. The addition of air or other gas including oxygen, however, should be stopped before all the secondary phosphine formed is converted into other chemical species. Examples of tertiary phosphines include, but are not limited to, trialkyl phosphines such as tri-n-octylphosphine, tri-n-butylphosphine, tri-aryl phosphines.

According to a certain aspect, a solution of a highly reactive metal source, such as $Cd(Oleate)_2$ and a seed stabilizing agent, such as octadecylphosphonic acid is provided at a reaction temperature, such as by heating, after which a secondary phosphine chalcogenide or secondary phosphine chalcogenide precursor or oxygen-treated tertiary phosphine chalcogenide is rapidly added to the solution of the metal source whereupon nanocrystals including the metal and the chalcogenide form in a reaction mixture. The reaction is terminated resulting in nanocrystals of certain size. According to one aspect, the precursors are provided in quantitative or stoichiometric amounts such that substantially no unreacted precursors are present in the reaction media once a quantum dot of desired size is obtained. According to one aspect, the reaction is terminated according to methods known to those of skill in the art which may include termination by use of a chemical agent, termination by use of a temperature reduction such as by injection of a fluid, such as 1-octadecene, having a temperature lower than the reaction temperature thereby lowering the temperature of the media to a quenching temperature, termination by use of isolation material or dilution of reactive ingredients to a point where the reactive ingredients are no longer effectively reactive. According to one aspect, the reaction is terminated by rapidly cooling the reaction mixture to a quenching temperature where the reaction substantially terminates and further growth of the quantum dots is substantially prevented. Such a quenching temperature can be determined by those of skill in the art and is selected to prevent Ostwald ripening of the quantum dots. It is to be understood that different reaction temperatures may exist for different reaction mixtures. Likewise, it is to be understood that different quenching temperatures may exist for different reaction mixtures. Accordingly, reaction temperatures include those at which quantum dots may be created and quenching temperatures include those at which the quantum dot growing process is terminated or quenched resulting in quantum dots of desired size. Preferably, the growth process is quenched by lowering the temperature to stop nucleation and Ostwald ripening. Quantum dots present in the reaction vessel preferably remain in the reaction vessel and media for further growth under suitable conditions.

According to one aspect, highly reactive metal and chalcogenide precursors or reactants such as $Cd(Oleate)_2$ and a secondary phosphine chalcogenide or secondary phosphine chalcogenide precursor or oxygen-treated tertiary phosphine are provided to a reaction vessel including the seed quantum dots preferably remaining in the vessel from the previous step as a substantially steady or substantially constant infusion or feed or source such that as metal and chalcogenide precursors are consumed or otherwise used to grow the quantum dots, additional supply of metal and chalcogenide precursors are provided to the reaction vessel, such as in a substantially continuous manner at a temperature sufficient to continue growth of the seed quantum dots until a desired quantum dot size is reached. According to one aspect, the precursors are provided in quantitative or stoichiometric amounts such that substantially no unreacted precursors are present in the reaction media once a quantum dot of desired size is obtained. In a preferred aspect, the growth temperature for growing CdSe can be in a range from about 200 to about 240° C. Different temperatures may be desirable for quantum dots comprising different semiconductor materials.

According to a certain aspect, a solution of a highly reactive metal source and a seed stabilizing agent is provided at a reaction temperature, such as by heating, after which a secondary phosphine chalcogenide or secondary phosphine chalcogenide precursor or oxygen-treated tertiary phosphine is rapidly added, such as by injection, into the solution of the metal source to form a reaction mixture whereupon the metal and the chalcogenide combine to form nanocrystals. Immediately after addition of the secondary phosphine chalcogenide is completed, the reaction mixture is rapidly cooled to a quenching temperature by addition of a fluid, such as 1-octadecene, having a temperature lower than the reaction temperature thereby lowering the temperature of the media to a quenching temperature thereby terminating or quenching the growth of nanocrystals. According to one aspect, the metal source and the secondary phosphine chalcogenide or secondary phosphine chalcogenide precursor or oxygen-treated tertiary phosphine are provided in quantitative or stoichiometric amounts such that substantially no unreacted precursors are present in the reaction media when quantum dot growth is terminated. According to certain aspect, the reaction, i.e. formation of nanocrystals, is terminated thereby resulting in nanocrystals of certain size by quenching methods known to those of skill in the art. According to one aspect, the reaction is terminated by rapidly cooling the reaction mixture to a temperature below that of the reaction temperature and at which Ostwald ripening does not occur. Quantum dots are then present in the reaction vessel and then may be optionally isolated or recovered. According to one aspect, substantially no unreacted precursors are present in the reaction media.

According to one aspect, metal and chalcogenide precursors or reactants such as secondary phosphine chalcogenide or secondary phosphine chalcogenide precursor or oxygen-treated tertiary phosphine are provided to a reaction vessel including the quantum dots to be further grown (e.g., from the previous quench step without isolation) as a substantially steady or substantially constant infusion or feed or source such that as metal and chalcogenide precursors are consumed or otherwise used to grow the quantum dots, additional supply of metal and chalcogenide precursors are provided to the reaction vessel, such as in a substantially continuous manner, to continue growth of the quantum dots until a desired quantum dot size is reached. According to one aspect, the precursors are provided in quantitative or stoichiometric amounts such that substantially no unreacted precursors are present in the reaction media once a quantum dot of desired size is obtained.

According to a certain aspect, quantum dots of certain desired size are created by selecting a certain initial reaction temperature of a solution of a metal source, followed by rapid addition, such as by injection, of a secondary phosphine chalcogenide or secondary phosphine chalcogenide precursor or oxygen-treated tertiary phosphine to produce a reaction mixture. Immediately after completion of the rapid addition of the secondary phosphine chalcogenide or secondary phosphine chalcogenide precursor or oxygen-treated tertiary phosphine, the reaction mixture is rapidly cooled to a quenching temperature to stop or otherwise inhibit further nanocrystal growth. According to this aspect, a higher initial reaction temperature will produce quantum dots of larger diameter compared to a lower initial reaction temperature. In this manner, a method is provided of tuning quantum dot size by selecting an initial reaction temperature which is rapidly lowered to a quenching temperature. Without wishing to be bound by scientific theory, the higher the initial reaction temperature, the longer the reaction mixture is allowed to react, and accordingly, the longer the particles are allowed to grow before reaching a temperature at which the reaction is substantially or effectively terminated. Once the reaction is terminated, the quantum dots produced may then be contacted with metal and chalcogenide precursors or reactants such as secondary phosphine chalcogenide or secondary phosphine chalcogenide precursor or oxygen-treated tertiary phosphine provided to a reaction vessel including the quantum dots as a substantially steady or substantially constant infusion or feed or source such that as metal and chalcogenide precursors are consumed or otherwise used to grow the quantum dots, additional supply of metal and chalcogenide precursors are provided to the reaction vessel, such as in a substantially continuous manner, to continue growth of the quantum dots until a desired quantum dot size is reached.

According to certain aspects, a secondary phosphine chalcogenide may be provided to the reaction mixture as a secondary phosphine chalcogenide or as a precursor to a secondary phosphine chalcogenide or as an oxygen treated tertiary phosphine chalcogenide. Suitable precursor compounds include tertiary phosphine chalcogenides which may be oxidized in the reaction mixture to produce secondary phosphine chalcogenides for use in the process of making quantum dots. Alternatively, tertiary phosphine chalcogenides may be oxidized prior to addition to a reaction mixture to produce secondary phosphine chalcogenides for use in the process of making quantum dots.

According to certain aspects, quantum dots may be made according to the present invention in the absence of amine compounds in the reaction mixture. According to this aspect, a reaction mixture is substantially free of amine compounds or substantially excludes amine compounds.

According to certain aspects, quantum dots may be made according to the invention described herein with ligands attached to the surface of the quantum dots. According to this aspect, ligand-providing compounds can be included into the reaction mixture used to produce the quantum dots. Such ligand-providing compounds include carboxylates, phosphonates, phosphonites and the like.

According to a certain aspect, quantum dots produced by the methods described herein can then be coated with one or more coatings including semiconductor materials. Quantum dots produced by the methods described herein need not be isolated or purified prior to a coating process. According to certain aspects of the present invention, the initial quantum dot production step and the growth step are carried out using quantitative or stoichiometric amounts of precursors or reactants such that no or substantially no unreacted precursors remain in the reaction media or the quantum dots thereby preventing the need for an isolation or purification step prior to coating the quantum dots.

A coating layer can comprise one or more inorganic materials. A coating layer can comprise one or more semiconductor materials. A coating layer can comprise one or more different semiconductor materials. A coating layer can comprise more than one layer. When multiple layers are included on the semiconductor nanocrystals, each layer can have a composition that is the same or different from that of an adjacent layer. When multiple layers are included on the semiconductor nanocrystals, each layer can have a composition that is same or different from that of any other layer.

In accordance with a certain aspect of the present invention, a method is provided for increasing the yield of quantum dots using the invention described herein. For example, the method includes providing a solution of a metal source and a seed stabilizing agent at a reaction temperature and to which a secondary phosphine chalcogenide or secondary phosphine chalcogenide precursor or oxygen-treated tertiary phosphine chalcogenide is rapidly added to the solution of the metal source whereupon nanocrystals including the metal and the chalcogenide form in a reaction mixture. The reaction is terminated resulting in nanocrystals of certain size. The nanocrystals may then be subjected to further growth conditions as described herein to result in a quantum dot of desired size.

In methods of the invention taught herein, quenching can preferably comprise dropping the temperature to a temperature sufficiently low to prevent nucleation and Ostwald ripening, but also sufficiently high for a subsequent growth step, if desired. For example, a temperature such as ~240° C. could be used with a system including growth of a quantum dot core comprising CdSe.

Each of the original claims set forth at the end of the present application are hereby incorporated into this Summary section by reference in its entirety.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
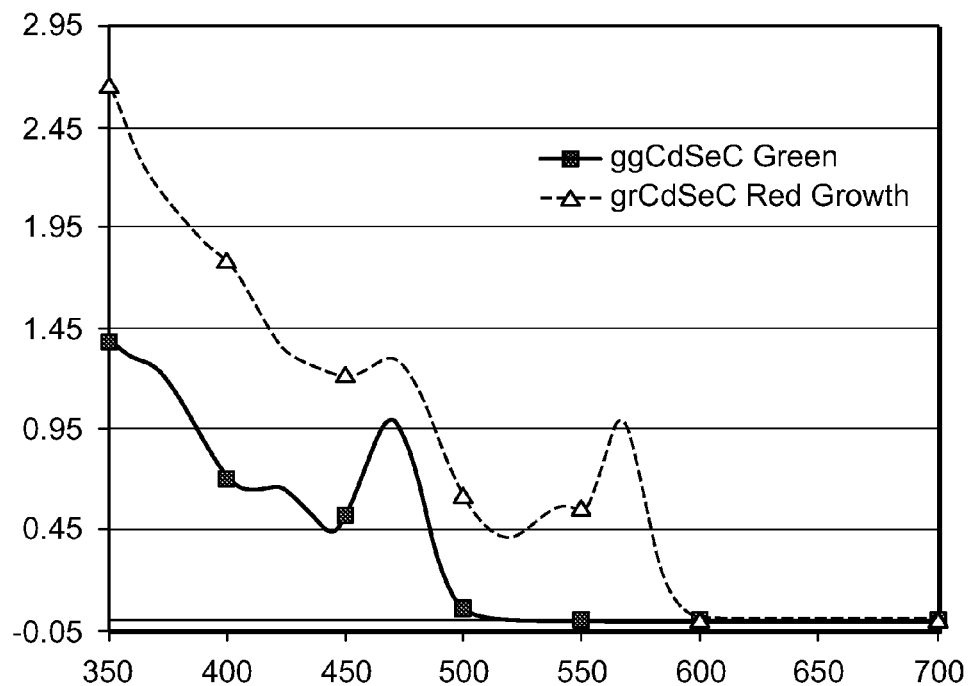
FIG. 1 is an absorbance spectrum of quantum dot cores made by methods of the present invention.

The attached figures are simplified representations presented for purposes of illustration only.

For a better understanding of the present invention, together with other advantages and capabilities thereof, reference is made to the following disclosure and appended claims in connection with the above-described drawings.

DETAILED DESCRIPTION OF THE INVENTION

Embodiments of the present disclosure are directed to methods of making quantum dots. Quantum dots or nanocrystals are nanometer sized semiconductor particles that can have optical properties arising from quantum confinement. Quantum dots can have various shapes, including, but not limited to, a sphere, a rod, a disk, other shapes, and mixtures of various shaped particles. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety. The narrow FWHM of quantum dots can result in saturated color emission. In certain embodiments, FWHM can be, for example, less than 60, less than 50, less than 40, or less than 30. The broadly tunable, saturated color emission over the entire visible spectrum of a single material system is unmatched by any class of organic chromophores (see, for example, Dabbousi et al., *J. Phys. Chem.*, 101, 9463 (1997), which is incorporated by reference in its entirety). A monodisperse population of quantum dots will emit light spanning a narrow range of wavelengths.

According to exemplary embodiments, quantum dots of a certain size are formed in a first step by combining an M donor and a seed stabilizing agent in a liquid medium at a reaction temperature with an X donor to form a reaction mixture producing quantum dots including the M component from the M donor and the X component from the X donor. The M component from the M donor and the X component from the X donor may be present in a ratio where the M component is in slight excess to the X component. Suitable ratios of X component to M component include about 0.5 to about 1, about 0.6 to about 1, about 0.7 to about 1, about 0.8 to about 1, about 0.9 to about 1 and about 1 to about 1. After the M component and the X component are combined to create quantum dots of desired size, the reaction is terminated or quenched, such as by cooling the reaction mixture to a quenching temperature at which the reaction substantially terminates. According to one aspect, substantially no unreacted precursors are present in the reaction medium.

According to exemplary embodiments, quantum dots of a certain size are formed by combining a highly reactive metal source or donor and a seed stabilizing agent in a liquid medium at a reaction temperature with a secondary phosphine chalcogenide or secondary phosphine chalcogenide precursor compound or oxygen-treated tertiary phosphine chalcogenide to form a reaction mixture producing quantum dots including the metal source and the chalcogenide. After the metal source and the secondary phosphine chalcogenide or secondary phosphine chalcogenide precursor compound or oxygen-treated tertiary phosphine chalcogenide are combined to create quantum dots of desired size, the reaction is terminated or quenched, such as by cooling the reaction mixture to a quenching temperature at which the reaction substantially terminates and the quantum dots precipitate out of solution and may be optionally collected or isolated. In certain embodiments, a metal source can comprise one or more highly reactive metal sources which can be the same or different. In certain embodiments, a chalcogenide source can comprise one or more highly reactive chalcogenide sources which can be the same or different. According to one aspect, the precursors are provided in quantitative or stoichiometric amounts such that substantially no unreacted precursors are present in the reaction media once a quantum dot of desired size is obtained.

A reaction temperature is preferably sufficient for reacting one or more metal sources and one or more chalcogen sources to form a semiconductor material comprising one or more metals and one or more chalcogens.

According to aspects of the present disclosure, an exemplary reaction temperature is between about 125° C. and about 400° C., between about 150° C. and about 350° C., between about 175° C. and about 325° C., between about 200° C. and about 300° C., above about 150° C., above about 175° C., above about 200° C., above about 225° C., above about 230° C., above about 240° C., above about 250° C., above about 260° C., above about 270° C., above about 275° C., above about 280° C., above about 290° C., above about 300° C., above about 310° C., above about 320° C., and the like. An exemplary reaction temperature is about 260° C., about 265° C., about 270° C., about 275° C., about 280° C., about 290° C., about 300° C., or about 310° C.

In certain embodiments, a quenching temperature is selected to be sufficient to slow, and preferably stop, further reaction of one or more metal sources and one or more chalcogen sources.

An exemplary quenching temperature at which the reaction produces quantum dots is lower than the particular reaction temperature being used and may be about 250° C., about 240° C., about 230° C. or about 220° C. According to certain aspects of the present disclosure, a quenching temperature is substantially lower than a reaction temperature. An exemplary quenching temperature is between about 20° C. and about 150° C. lower than a given reaction temperature, between about 30° C. and about 125° C. lower than a given reaction temperature, about 40° C. and about 125° C. lower than a given reaction temperature, about 20° C. and about 50° C. lower than a given reaction temperature, or about 30° C. lower than a given reaction temperature.

In a second step, the quantum dots are then increased in size or "grown" when the quantum dots are combined with an M donor and an X donor under conditions where the M component of the M donor and the X component of the X donor combine with the quantum dots to create a larger quantum dot over time. According to one aspect, the M donor or the X donor or both are highly reactive. Accordingly, exemplary methods described herein may have a first core-producing step and a second growth step to produce quantum dots of a given size. According to one aspect, the precursors are provided in quantitative or stoichiometric amounts such that substantially no unreacted precursors are present in the reaction media once a quantum dot of desired size is obtained.

In accordance with one aspect, the ratio of moles of secondary phosphine chalcogenide or secondary phosphine chalcogenide precursor compound or oxygen-treated tertiary phosphine chalcogenide to moles of metal in the reaction mixture is less than or equal to one. According to one aspect, the moles of metal are slightly higher than the moles of chalcogenide in the reaction mixture. An exemplary ratio of moles of metal to moles of chalcogenide is about 1 to about 0.5, about 1 to about 0.6, about 1 to about 0.7, about 1 to about 0.8, about 1 to about 0.9, about 1 to about 1.

According to an additional aspect, the quantum dots are then increased in size or "grown" when the quantum dots are combined with a metal source or donor and a secondary phosphine chalcogenide or secondary phosphine chalcogenide precursor compound or oxygen-treated tertiary phosphine chalcogenide under conditions where the metal and the chalcogenide combine with the quantum dots to create a larger quantum dot over time. Accordingly, exemplary methods described herein may have a first core-producing step and a second growth step to produce quantum dots of a given size.

According to an exemplary embodiment including a highly reactive metal precursor comprising cadmium and a highly reactive secondary phosphine chalcogenide or secondary phosphine chalcogenide precursor or oxygen-treated tertiary phosphine chalcogenide comprising selenium, the precursors are selected such that upon their combination in a liquid medium in a ratio of chalcogenide to metal of about 0.8 to about 1 and including a seed stabilizing agent at a temperature of about 270° C., the metal precursor and the chalcogenide react to form quantum dots of metal and chalcogenide having a desirable peak absorbance, such as between about 500 nm and about 700 nm. According to one aspect, the quantum dots are formed rapidly upon combination of the metal precursor and the chalcogenide in the reaction vessel. According to one aspect, the metal precursor is in a reaction vessel with a seed stabilizing agent in a liquid medium at a temperature of about 270° C. The secondary phosphine chalcogenide or secondary phosphine chalcogenide precursor or oxygen-treated tertiary phosphine chalcogenide is rapidly added to the reaction vessel and the liquid medium whereupon quantum dots including the metal and the chalcogenide of a desired peak absorbance are formed upon the rapid addition of the chalcogenide. After rapid addition of the chalcogenide is completed, the reaction vessel is immediately cooled to a quenching temperature of about 240° C. or below by addition of 1-octadecene at a temperature lower than the reaction temperature so as to substantially terminate the reaction. According to one aspect, the precursors are provided in quantitative or stoichiometric amounts such that substantially no unreacted precursors are present in the reaction media once a quantum dot of desired size is obtained.

According to certain aspects, quantum dots can be created in a single reaction vessel where quantum dots of a certain size are formed by combining a highly reactive metal source or donor and a seed stabilizing agent in a liquid medium at a reaction temperature with a secondary phosphine chalcogenide or secondary phosphine chalcogenide precursor compound or oxygen-treated tertiary phosphine chalcogenide to form a reaction mixture producing quantum dots including the metal source and the chalcogenide. After the metal source and the secondary phosphine chalcogenide or secondary phosphine chalcogenide precursor compound or oxygen-treated tertiary phosphine chalcogenide are combined to create quantum dots of desired size, the reaction is terminated or quenched, such as by cooling the reaction mixture to a quenching temperature at which the reaction substantially terminates and the quantum dots precipitate out of solution. The precursors are provided in quantitative or stoichiometric amounts such that substantially no unreacted precursors are present in the reaction media once a quantum dot of desired size is obtained. Because substantially no unreacted precursors are present in the media, the quantum dots need not be isolated or purified before they are subjected to further growth conditions. According to one aspect, highly reactive metal precursors and highly reactive chalcogenide precursors or reactants such as secondary phosphine chalcogenide or secondary phosphine chalcogenide precursor or oxygen-treated tertiary phosphine are provided to the reaction vessel including the quantum dots as a substantially steady or substantially constant infusion or feed or source such that as metal and chalcogenide precursors are consumed or otherwise used to grow the quantum dots, additional supply of metal and chalcogenide precursors are provided to the reaction vessel, such as in a substantially continuous manner, to continue growth of the quantum dots until a desired quantum dot size is reached. According to one aspect, the precursors are provided in quantitative or stoichiometric amounts such that substantially no unreacted precursors are present in the reaction media once a quantum dot of desired size is obtained. Because substantially no unreacted precursors are present in the media, the quantum dots need not be isolated or purified before they are subjected to coating conditions. Accordingly, suitable coating precursors can then be added to the reaction vessel including quantum dots which are then coated with one or more coatings including semiconductor materials.

Exemplary quantum dots according to the present disclosure include those having metal from the metal precursors and chalcogenide from the secondary phosphine chalcogenide or secondary phosphine chalcogenide precursor compound or oxygen-treated tertiary phosphine chalcogenide. Accordingly, exemplary quantum dots include those of the formula MX, where M is a metal from a metal donor and X is a compound from an X donor which is capable of reacting with the metal donor to form a material with the general formula MX. In certain embodiments, the M donor and the X donor can be moieties within the same molecule.

The M donor or metal precursor can be an inorganic compound, an organometallic compound, or elemental metal.

Metal precursor can constitute a wide range of substances, such as a metal oxide, a metal carbonate, a metal bicarbonate, a metal sulfate, a metal sulfite, a metal phosphate, metal phosphite, a metal halide, a metal carboxylate, a metal alkoxide, a metal thiolate, a metal amide, a metal imide, a metal alkyl, a metal aryl, a metal coordination complex, a metal solvate, a metal salt, and the like.

Examples of metals include cadmium, zinc, magnesium, mercury, aluminum, gallium, indium, thallium, or mixtures thereof. Other metals that can react to form a semiconductor comprising a metal chalcogenide can also be used.

Exemplary metal precursors include dimethylcadmium and cadmium oleate. For example, an M donor or metal precursor can comprise cadmium, zinc, magnesium, mercury, aluminum, gallium, indium, thallium, lead, germanium or mixtures thereof.

The X donor can comprise a chalcogenide donor where X is a chalcogenide including oxygen, sulfur, selenium, or tellurium, or mixtures thereof. Suitable chalcogenide donors include a reactive chalcogenide source, such as highly reactive chalcogenide sources such as $(TMS)_2Se$, $(TMS)_2S$, $H_2S$, chalcogenide mixtures such as octadecene-Se, (ODE/Se), octadecene-S (ODE/S), amine-Se, amine-S, oxygen-treated tertiary phosphine chalcogenide and mixtures thereof and secondary phosphine chalcogenides include a secondary phosphine sulfide, a secondary phosphine selenide, a secondary phosphine telluride, or a secondary phosphine oxide, dialkyl phosphine chalcogenides such as diisobutylphosphine selenide, diisobutylphosphine sulfide, diphenylphosphine selenide, diphenylphosphine sulfide or mixtures thereof or mixtures of any of the above.

Additional X components include nitrogen, phosphorus, arsenic, antimony or mixtures thereof. The X donor can comprise a compound capable of reacting with the M donor to form a material with the general formula MX. The X donor can comprise a chalcogenide donor or a pnictide donor, such as a phosphine chalcogenide, a bis(silyl) chalcogenide, dioxygen, an ammonium salt, or a tris(silyl) pnictide. Suitable X donors include, for example, but are not limited to, dioxygen, bis(trimethylsilyl) selenide $((TMS)_2Se)$, trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride $((TMS)_2Te)$, bis(trimethylsilyl)sulfide $((TMS)_2S)$, a trialkyl phosphine sulfide such as (tri-n-octylphosphine) sulfide (TOPS), an ammonium salt such as an ammonium halide (e.g., $NH_4Cl$), tris(trimethylsilyl) phosphide $((TMS)_3P)$, tris (trimethylsilyl) arsenide $((TMS)_3As)$, or tris(trimethylsilyl) antimonide $((TMS)_3Sb)$. In certain embodiments, the M donor and the X donor can be moieties within the same molecule.

Exemplary seed stabilizing agents include a phosphonic acid such as octadecylphosphonic acid, tetradecylphosphonic acid, etc.

Exemplary fluids which can be introduced into the reaction mixture of an M donor and an X donor to bring the reaction temperature to a quenching temperature include 1-octadecene, squalane, tri-n-octylphosphine (TOP), N-DodecylPyrrolidone (NDP). Such fluids can be introduced to the reaction media at a temperature below that of the reaction temperature and between about 4 degrees and about 40 degrees. Typically room temperature fluid is used. Suitable fluids are those which are non-reactive towards the other species within the reaction and those that are miscible with the solvent within the reaction.

Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

Examples of materials suitable for use as quantum dot cores include, but are not limited to, ZnO, ZnS, ZnSe, ZnTe, CdO, CdS, CdSe, CdTe, MgS, MgSe, GaSe, HgO, HgS, HgSe, HgTe, PbO, PbS, PbSe, PbTe, an alloy including any of the foregoing, and/or a mixture including any of the foregoing, including ternary and quaternary mixtures or alloys.

A semiconductor nanocrystal (including a semiconductor nanocrystal core of a core/shell semiconductor nanocrystal) can comprise one or more semiconductor materials at least one of which comprises at least one metal and at least one chalcogen. Examples of semiconductor materials include, but are not limited to, Group II-VI compounds (e.g., binary, ternary, and quaternary compositions), Group III-VI compounds (e.g., binary, ternary, and quaternary compositions), Group IV-VI compounds (e.g., binary, ternary, and quaternary compositions), Group I-III-VI compounds (e.g., binary, ternary, and quaternary compositions), Group II-IV-VI compounds (e.g., binary, ternary, and quaternary compositions), and alloys including any of the foregoing, and/or a mixture including any of the foregoing. Semiconductor nanocrystals can also comprise one or more semiconductor materials that comprise ternary and quaternary alloys that include one or more of the foregoing compounds.

As discussed herein, a semiconductor nanocrystal on which a coating is grown in accordance with the present invention can comprise one or more shells over a surface of the core. A shell typically comprises a semiconductor material. A shell can comprise a Group II-VI compound, Group II-V compound, Group III-VI compound, Group III-V compound, Group IV-VI compound, Group compound, Group II-IV-VI compound, and Group II-IV-V compound. Non-limiting examples of such semiconductor materials include, but are not limited to, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, a mixture including any one or more of the foregoing, an alloy including any one or more of the foregoing, etc. In certain embodiments, a shell can comprise a Group IV element.

According to an exemplary embodiment, the liquid medium includes solvents such as coordinating solvents. Alternatively, non-coordinating solvents can also be used in certain applications. A coordinating solvent is a compound having a donor lone pair that, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, N-dodecylpyrrolidone (NDP) and hexyl octanoate. In certain embodiments, technical grade TOPO can be used.

According to one aspect, the solvent is at a reaction temperature of above about 200° C. According to an additional aspect the solvent is at a reaction temperature of between about 200° C. and 400° C. According to one aspect, the metal precursor and the secondary phosphine chalcogenide or secondary phosphine chalcogenide precursor compound or oxygen-treated tertiary phosphine chalcogenide are introduced into a reaction vessel and the solvent at substantially the same time. Alternatively, the metal precursor is in the solvent in the reaction vessel and the chalcogenide is added to the solvent in the reaction vessel.

According to one aspect, the M component from the M donor and the X component from the X donor, for example the metal and the chalcogenide react together in a colloidal growth process to produce quantum dots. According to an exemplary aspect, the X donor, for example, a chalcogenide is added to the solvent by injection. For a given volume of secondary phosphine chalcogenide or secondary phosphine chalcogenide precursor or oxygen-treated tertiary phosphine chalcogenide, rapid addition such as by injection includes an addition accomplished in between about 0.5 seconds and about 60 seconds, between about 5 seconds and about 50 seconds, between about 10 seconds and about 30 seconds, between about 1 second to about 3 seconds, between about 1 second to about 2 seconds and the like.

Rapid injection methods and devices are known to those of ordinary skill in the art and include manual injection such as by syringe or automated injection such as by pneumatic pressure operating on a container or vessel including the X donor or chalcogenide reactant. Without wishing to be bound by scientific theory, the injection of the chalcogenide permits discrete nucleation and results in the growth of quantum dots including the metal and the chalcogenide. A first absorbance peak of the quantum dots will be dependent upon the particular semiconductor being formed and the corresponding band-gap of the semiconductor. For example, an exemplary first absorbance peak for a CdSe nanocrystal may be between about 420 nm and 480 nm. According to one aspect, CdSe quantum dots having a first absorbance peak between about 420 nm and 480 nm are formed within about 0.5 seconds to about 10 seconds after injection of the chalcogenide into the solvent including the metal precursor. According to one aspect, CdSe quantum dots having a first absorbance peak between about 420 nm and 480 nm are formed within about 1 second to about 8 seconds, within about 1 second to about 5 seconds or immediately after injection of the chalcogenide into the solvent including the metal precursor.

However, it is to be understood that quantum dots with any desirable absorbance peak may be produced by the methods of the present invention by altering the reaction time to produce core quantum dots, the growth process to produce quantum dots, the coating process to produce overcoated quantum dots and the like.

After quantum dots are formed in the reaction vessel, the reaction may be terminated or quenched by, for example, cooling the reaction mixture. According to one aspect, the reaction vessel is cooled to a temperature of below the reaction temperature and to a temperature at which Ostwald ripening does not occur using a suitable heat sink. According to one aspect, the reaction vessel is submerged in a cooling bath such that rapid cooling of the reaction mixture is achieved. Cooling baths according to the present disclosure include any suitable cooling bath medium. Exemplary cooling baths include water or other fluids which can be maintained at low temperatures suitable for rapidly cooling reaction media and include a bath of squalane cooled with liquid nitrogen. The reaction vessel can then be contacted with the bath and the temperature of the reaction vessel is lowered to a temperature at which the reaction terminates.

According to one aspect, the size of the quantum dots produced as a result of rapid injection followed by immediate and rapid cooling may be dependent upon the initial reaction temperature of the liquid solvent. For example, it is contemplated that a higher initial reaction temperature may produce larger quantum dots insofar as the time it takes to rapidly cool the reaction vessel to a temperature of below the reaction temperature and at which Ostwald ripening does not occur will be longer when the initial reaction temperature is higher. According to this aspect, a method is provided for producing quantum dots of a particular size by selecting an initial reaction temperature followed by rapid injection and then immediate and rapid cooling of the reaction mixture to a temperature at which the reaction terminates and at which Ostwald ripening is avoided.

The quantum dots produced as a result of rapid injection and rapid cooling are then combined with an M donor or metal precursor and an X donor such as a secondary phosphine chalcogenide or secondary phosphine chalcogenide precursor compound or oxygen-treated tertiary phosphine chalcogenide under conditions which allow the quantum dots to grow in size by addition of the metal and the calcogenide. According to one aspect, the quantum dots produced as a result of rapid injection and rapid cooling may be isolated or recovered, for example by precipitation with additional of butanol and methanol in a ratio of 1 to 1.5 to 0.5 v/v/v quantum dot stock solution to butanol to methanol, and then placed into a non-coordinating solvent in a reaction vessel at a temperature of between about 200° C. to about 250° C., between about 210° C. to about 240° C. or between about 220° C. to about 240° C. Non-coordinating solvents include 1-decene, 1-dodecene, 1-tetradecene, 1-hexadecene, 1-octadecene, 1-icosene and 1-docosene and the like.

An M donor such as a metal precursor and an X donor such as a secondary phosphine chalcogenide are added as reactants in a substantially continuous manner to the reaction vessel. In an exemplary reaction, Cd and Se precursor are prepared in separate vessels at 0.5M concentration in a solution of trioctylphosphine, and introduced into the reaction vessel containing 480 nm absorbing seed particles (7.7 mmol Cd in 320 mL ODE), at a rate of 40 mL/hour. Exemplary metal precursors include cadmium oleate and the like. Exemplary secondary phosphine chalcogenides include a dialkylphosphine selenide such as diisobutylphosphine selenide or diphenylphosphine selenide and the like.

As the M donor such as a metal precursor and an X donor such as a secondary phosphine chalcogenide are added to the reaction vessel, they are consumed as reactants in the growth process of the quantum dots. According to this aspect, the quantum dots grow in size as reactants are continuously fed into the reaction vessel and consumed in the growth process. According to one aspect, the M donor such as a metal precursor and an X donor such as a secondary phosphine chalcogenide are added using methods and devices known to those of skill in the art to meter reactants into a reaction vessel at a desired rate such as a syringe pump. The metal precursor, also referred to herein as a metal source or a metal donor is provided in a liquid medium including trioctylphosphine, 1-octadecene or mixtures thereof at a temperature of between about 20° C. to about 25° C. and a concentration of between about 0.25M to about 1.0M. The secondary phosphine chalcogenide is provided in a liquid medium including trioctylphosphine, 1-octadecene, N-dodecylpyrrolidone or mixtures thereof at a temperature of between about 20° C. to about 25° C. and a concentration of between about 0.25M to about 1.0M.

According to one aspect, the quantum dot, which may be also referred to as a core, is continuously grown in size from its initial size to a final size or from an initial first absorbance peak to a final absorbance peak. For example, the core may have an initial first absorbance peak of between about 420 nm to about 480 nm. The core may be grown, such as continuously, to a final first absorbance peak of between about 450 nm to about 600 nm, such as 500 nm, 520 nm, 540 nm, 560 nm or 580 nm. According to this aspect, the quantum dots or cores are grown to a final size or final absorbance peak as precursors are continuously added to the reaction vessel.

According to an exemplary aspect, quantum dot core particles are made by reaction of Cd(Oleate) and diisobutylphosphine selenide or diphenylphosphine selenide, which are highly reactive precursors, in a reaction medium including octadecylphosphonic acid as a seed stabilizing agent at a temperature of about 270° C. and with the Cd(Oleate)$_2$ and diisobutylphosphine selenide or diphenylphosphine selenide being in a ratio of about 1 to 0.8. The ratio of Cd(Oleate)$_2$ to octadecylphosphonic acid is about 1.0 to 0.1. Prior to the point at which the quantum dots begin to react together in a process called Ostwald ripening or broadening, the reaction is terminated by rapidly cooling the reaction medium by rapidly injecting a solution of 1-octadecene to reduce the temperature to about 240° C. The medium is then continuously infused with Cd(Oleate)$_2$ and diisobutylphosphine selenide or diphenylphosphine selenide at a temperature between about 240° C. and 270° C. and to increase the size of the quantum dots to a desired size. The ratio of the Cd(Oleate)$_2$ to diisobutylphosphine selenide or diphenylphosphine selenide is about 1 to 0.8.

Resulting quantum dots are members of a population of quantum dots. As a result of the discrete nucleation and rapid cooling described herein, the population of quantum dots that can be obtained has a narrow, monodisperse distribution of diameters. The monodisperse distribution of diameters can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5% rms.

Quantum dots of the present invention may be between about 2.2 nm and about 2.6 nm in diameter or between about 2.8 nm and about 6.0 nm in diameter. In general, quantum dots according to the present disclosure can have an average particle size in a range from about 1 to about 1000 nanometers (nm), and preferably in a range from about 1 to about 100 nm. In certain embodiments, quantum dots have an average particle size in a range from about 1 to about 20 nm (e.g., such as about 2, 3, 4, 5, 6, 7, 8, 9, 10, 11, 12, 13, 14, 15, 16, 17, 18, 19, or 20 nm). In certain embodiments, quantum dots have an average particle size in a range from about 1 nm to about 20 nm or about 1 nm to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

According to embodiments described herein, the methods described herein produce quantum dots characterized by a continuous wavelength shift to the red and a narrowing of the full-width at half maximum (FWHM) of the emission peak which is consistent with the theory of nanocrystal growth from molecular precursors.

According to an additional aspect of the present invention, the M donor such as a metal precursor and an X donor such as a secondary phosphine chalcogenide which are continuously added as reactants to generate quantum dot growth are consumed quantitatively to the extent that nearly 100% of the reactants metered into the reaction vessel are used to increase the size of the quantum dots.

Compared to conventional methods of making quantum dots, the exemplary method of rapid injection followed by immediate and rapid cooling to terminate the reaction resulting in seed core quantum dot particles and then quantum dot growth by continuous supply of reactants provides a greater number of seed core quantum dot particles having a first absorbance peak between about 420 nm to about 480 nm and accordingly a greater number of quantum dots having a first absorbance peak of between about 450 nm to about 600 nm resulting from the growth step.

In certain embodiments, quantum dots can include a core having one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

As discussed herein, a shell can be a semiconductor material. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell materials include, without limitation: red (e.g., (CdSe)CdZnS (core)shell), green (e.g., (CdZnSe) CdZnS (core)shell, etc.), and blue (e.g., (CdS)CdZnS (core shell.)

An example of an overcoating process is described, for example, in U.S. Pat. No. 6,322,901 incorporated herein in its entirety by reference. By adjusting the temperature of the reaction mixture during overcoating and monitoring the absorption spectrum of the core, overcoated materials having high emission quantum efficiencies (EQE) and narrow size distributions can be obtained.

The narrow size distribution of the quantum dots (including, e.g., semiconductor nanocrystals) allows the possibility of light emission in narrow spectral widths. Monodisperse semiconductor nanocrystals have been described in detail in Murray et al. (*J. Am. Chem. Soc.*, 115:8706 (1993)) hereby incorporated herein by reference in its entirety.

Size distribution during the reaction process can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

According to one aspect of the present disclosure, quantum dots of the present invention can include ligands attached thereto, such as aliphatic ligands. Such aliphatic ligands promote adhesion with a carrier particle. Such aliphatic ligands promote solubility or dispersability of the quantum dots bound to the carrier particles in a curable or polymerizable matrix material. According to one aspect, exemplary ligands include oleic acid ligands and octadecylphosphonic acid ("ODPA") ligands.

Ligands can be derived from a coordinating solvent that may be included in the reaction mixture during the growth process. Alternatively, ligands can be added to the reaction mixture or ligands can be derived from a reagent or precursor included in the reaction mixture for synthesizing the quantum dots. In certain embodiments, quantum dots can include more than one type of ligand attached to an outer surface.

A quantum dot surface includes ligands derived from the growth process or otherwise can be modified by repeated exposure to an excess of a competing ligand group (including, e.g., but not limited to, coordinating group) to exchange out the initial or native surface ligands, and/or form an overlayer. For example, a dispersion of capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

For example, a quantum dot can be exposed to short chain polymers which exhibit an affinity for the surface and which terminate in a moiety having an affinity for a suspension or dispersion medium, such as a curable matrix material. Such affinity improves the stability of the suspension and discourages flocculation of the quantum dot. Examples of additional ligands include fatty acids, long chain fatty acids such as oleic acid, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used.

Suitable coordinating ligands can be purchased commercially or prepared by ordinary synthetic organic techniques, for example, as described in J. March, Advanced Organic Chemistry, which is incorporated herein by reference in its entirety.

The emission from a quantum dot capable of emitting light can be a narrow Gaussian emission band that can be tuned through the complete wavelength range of the ultra-violet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse and preferably exhibits less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as between 0% to greater than 95%, for example in solution, such as greater than 10%, 20%, 30%, 40%, 50%, 60%, 70%, 80%, or 90%.

Quantum dots produced according to the present invention may be used in various applications. According to one aspect, quantum dots produced according to the methods described herein may be used in photoluminescent (PL) applications where quantum dot materials are excited optically and the optical excitation is downconverted via emission from the quantum dots. According to this aspect, exemplary applications include devices or systems where an LED light source is used, for example solid-state lighting, LED Backlights (LED-BLU), Liquid Crystal Displays (LCD) and the like. According to an additional aspect, quantum dots produced according to the methods described herein may be used in a device or system where a light source is downconverted to other wavelengths (e.g. solar concentrators or downconverters where sunlight is converted to specific wavelengths tuned to highest efficiency window of the solar cells used in the system.) Additional applications include plasma based systems where high energy plasma emission can excite a quantum dot downconverter, taggants, bio-labeling or imaging application, and barcoding or security/covert labeling applications. According to an additional aspect, quantum dots produced according to the present invention may be used in electroluminescent (EL) applications where quantum dots are excited electrically and the excitation results in emission from the quantum dots. According to this aspect, exemplary applications include direct charge injection into the quantum dots generating quantum dot excited states and subsequent quantum dot emission, energy transfer from other semiconductor materials within the device to the quantum dots, generating an excited state and subsequent quantum dot emission and the like. According to an additional aspect, quantum dots produced according to the present invention may be used in photovoltaic (PV) applications where the quantum dot materials are excited optically and the excitation results in current generation and/or a voltage due to carrier extraction from the quantum dots.

Additional information that may be useful in connection with the present disclosure and the inventions described herein is included in International Application No, PCT/US2009/002796 of Coe-Sullivan et al, filed 6 May 2009, entitled "Optical Components, Systems Including An Optical Component, And Devices"; International Application No. PCT/US2011/047284 of Sadasivan et al, filed 10 Aug. 2011 entitled "Quantum Dot Based Lighting"; International Application No. PCT/US2009/002789 of Coe-Sullivan et al, filed 6 May 2009, entitled "Solid State Lighting Devices Including Quantum Confined Semiconductor Nanoparticles, An Optical Component For A Solid State Light Device, And Methods"; U.S. patent application Ser. No. 12/283,609 of Coe-Sullivan et al, filed 12 Sep. 2008 entitled "Compositions, Optical Component, System Including An Optical Component, Devices, And Other Products"; International Application No. PCT/US2008/10651 of Breen et al, filed 12 Sep. 2008 entitled "Functionalized Nanoparticles And Method"; and International Application No. PCT/US2007/024320 of Clough et al, filed 21 Nov. 2007, entitled "Nanocrystals Including A Group Ina Element And A Group Va Element, Method, Composition, Device And Other Products"; U.S. application 61/486,748 filed May 16, 2011 entitled "Method for Preparing Semiconductor Nanocrystals" each of the foregoing being hereby incorporated herein by reference in its entirety.

EXAMPLE I

Preparation of Core Quantum Dots

Synthesis of CdSe Cores:

The following were added to a 100 ml reaction vessel: trioctylphosphine oxide (3.92 g), 1-octadecene (17.5 g), 1-octadecylphosphonic acid (1.66 g, 4.97 mmol), and Cd(oleate)$_2$ (1M solution in trioctylphosphine, 4.98 ml, 4.97 mmol). The vessel was subjected to 3 cycles of vacuum/nitrogen at 120° C., and the temperature was raised to 270° C. under nitrogen. At 270° C., a solution of 1M diisobutylphosphine selenide (DIBP-Se, 3.888 ml, 3.88 mmol) was rapidly injected, followed by injection of 5 ml of 1-octadecene to rapidly drop the temperature to about 230° C. resulting in the production of quantum dots with an initial absorbance peak between 420-450 nm.

EXAMPLE II

Growth of Core Quantum Dots

To the reaction medium of Example I, 0.5M Cd(oleate)$_2$ was continuously introduced along with 0.4M DIBP-Se at a rate of 1.5 ml/min using a syringe pump. The absorbance spectrum was monitored until the desired absorbance was reached, such as between 450 nm to 570 nm.

FIG. 1 is an absorbance spectrum of quantum dot core particles made according Example II targeting about 469 nm first absorbance peak (blue line) with about 15 nm HWHM and targeting about 565 nm first absorbance peak (red line) with about 12 nm HWHM.

EXAMPLE III

Overcoating a 469 nm Core to Target 515 nm Emission

Figure 2:
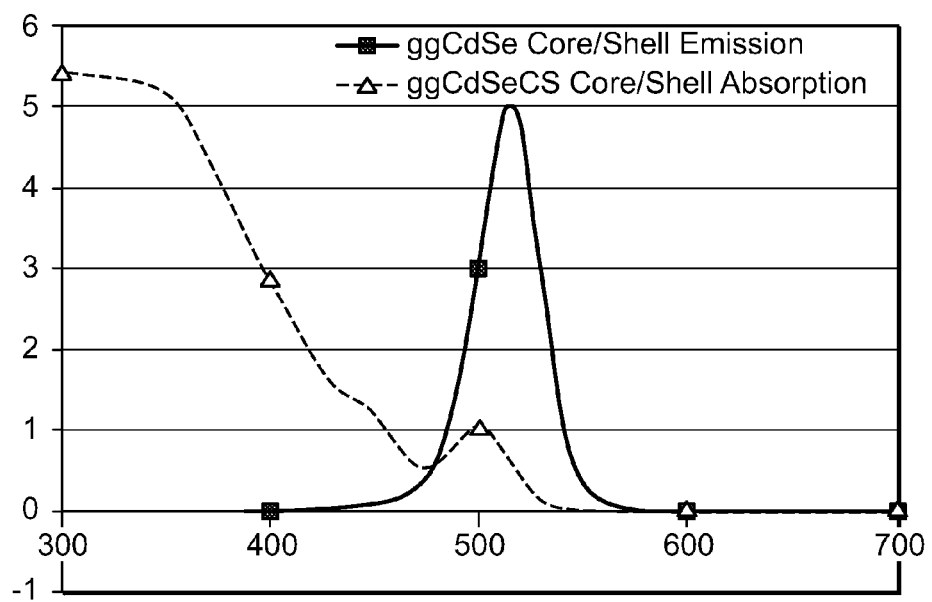
FIG. 2 is absorption and emission spectra for quantum dots made according to Example III.
Figure 3:
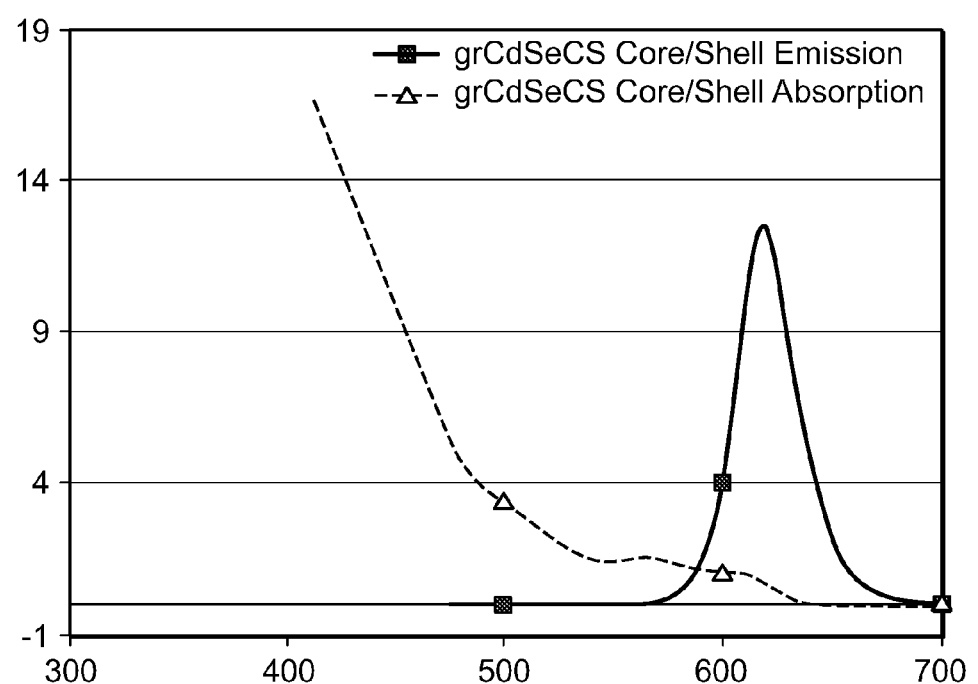
FIG. 3 is absorption and emission spectra for quantum dots made according to Example IV.

A green core (ggCdSeC-Green as in FIG. 1) was obtained directly from the medium produced in Example II (10.26 ml, 1.165 mmol Cd) and mixed in a 100 ml reaction vessel with $Zn(Oleate)_2$ (0.5M in trioctylphosphine, 6.9 ml). The reaction vessel was heated to 120° C. and vacuum applied for 15 minutes. The reaction vessel was back-filled with nitrogen and heated to 310° C. The temperature ramp was between 1° C./5 seconds and 1° C./15 seconds. Once the temperature reached 160° C., octanethiol (2.40 ml) was rapidly injected into the reaction vessel. When the temperature reached 230° C., a timer was started. The temperature continued to ramp to a set point of 310° C. Once the timer reached 30 minutes, a syringe containing $Zn(Oleate)_2$ (0.5M, 0.66 ml) and $Cd(Oleate)_2$ (1M, 2.38 ml), and TOP-S (2M, 6.18 ml) was rapidly injected. The temperature dropped to about 230° C. and returned to its 310° C. set point between 5 and 15 minutes. Once the timer reached 60 minutes, the heating mantle was dropped and the reaction was cooled by subjecting the vessel to a cool air flow. Quantum dots were precipitated by the addition of butanol (40 ml), methanol (10 ml) and then redispersed into toluene for storage (0.92 g of core/shell material.) FIG. 2A is absorption and emission spectra of the quantum dots having a 515 nm emission, 35-38 nm FWHM and a film EQE of greater than 90%.

EXAMPLE IV

Overcoating a 565 nm Core to Target 615 nm Emission

A red core (grCdSeC-Red as in FIG. 1) was obtained directly from the medium produced in Example II (5.19 ml, 0.050 mmol Cd) and mixed in a 100 ml reaction vessel with 1-octadecene (4.63 ml) and $Zn(Oleate)_2$ (0.5M in trioctylphosphine, 1.68 ml). The reaction vessel was heated to 120° C. and vacuum applied for 15 minutes. The reaction vessel was back-filled with nitrogen and heated to 310° C. The temperature ramp was between 1° C./5 seconds and 1° C./15 seconds. Once the temperature reached 300° C., octanethiol (0.73 ml) was rapidly injected into the reaction vessel and a timer was started. Once the timer reached 2 minutes, a syringe containing $Zn(Oleate)_2$ (0.5M, 3.26 ml) and $Cd(Oleate)_2$ (1M, 2.66 ml), and a another syringe containing octanethiol (2.74 ml) were rapidly injected into the reaction vessel. Once the timer reached 30 minutes, the heating mantle was dropped and the reaction was cooled by subjecting the vessel to a cool air flow. Quantum dots were precipitated by the addition of butanol (20 ml), methanol (5 ml) and then pellet redispersed into hexanes (3 ml). The sample was then precipitated once more via addition of butanol (3 ml), and methanol (1 ml), centrifuged and dispersed into toluene for storage (1.0 g of core/shell material.)

FIG. 2B is absorption and emission spectra of the quantum dots having a 515 nm emission, 35-38 nm FWHM and a film EQE of greater than 90%.

EXAMPLE V

The Tables below show comparative data for quantum dots made using several reaction procedures: a traditional core process (Table 1), an oxidized TBP process (Table 2), a secondary phosphine process (Table 3) and the process of Example I to produce a quantum dot core particle and Example II to grow or increase the size of the quantum dot (Table 4). All reactions used identical amounts of starting material and compare the final output of CdSe quantum dots. The traditional core process in a closed system produced a 6-10% yield. The oxidized TBP process where a TBP was oxidized to dialkylphosphine selenide for use as a selenium precursor produced about a 35% yield. Direct use of a dialkylphosphine selenide produced about a 50% yield. The method of Example I and Example II produced greater than 90% yield.

TABLE 1

Traditional Core Process

| Reagent | Material | Amount |
|---|---|---|
| Solvent | TOPO [g] | 315 |
|  | TOP [mL] | 184 |
| Cd Coordinator | ODPA [g] | 35.07 |
| Cd Source | Cd (OAc)2 [mmol] | 45.94 |
| Se Source | TBP-Se [mmol] | 157.5 |
| CdSe Absorbance [nm] | 496 |  |
| CdSe Output [mmol Cd] | 3.09 |  |
| % Yield | 6.7% |  |

TABLE 2

Oxidized TBP Process

| Reagent | Material | Amount |
|---|---|---|
| Solvent | TOPO [g] | 315 |
|  | TOP [mL] | 184 |
| Cd Coordinator | ODPA [g] | 35.07 |
| Cd Source | Cd(OAc)2 [mmol] | 45.94 |
| Se Source, oTBP generates dialkylphosphine selenides | oTBP-Se[mmol] | 157.5 |
| CdSe Absorbance [nm] | 473 |  |
| CdSe Output [mmol Cd] | 15.77 |  |
| % Yield | 34.3% |  |

TABLE 3

Secondary Phosphine Process

| Reagent | Material | Amount |
|---|---|---|
| Solvent | TOPO [g] | 315 |
|  | TOP [mL] | 184 |
| Cd Coordinator | ODPA [g] | 35.07 |
| Cd Source | Cd(OAc)2 [mmol] | 45.94 |
| Se Source, direct use of dialkylphosphine selenides | DIBP-Se in NDP [mmol] | 157.5 |
| CdSe Absorbance [nm] | 477 |  |
| CdSe Output [mmol Cd] | 23.58 |  |
| % Yield | 51.3% |  |

TABLE 4

2 Step Nucleation and Growth

| Purpose | Material | Amount |
|---|---|---|
| Stage 1- Nucleation | | |
| Solvent | TOPO [g] | 27.7 |
| | ODE [mL] | 157.1 |
| Cd source | Cd(Oleate) [mmol] | 35.24 |
| Se Source, direct use of dialkylphosphine selenides | DIBP-Se in NDP [mmol] | 27.48 |
| Seed stabilizer | ODPA [g] | 11.79 |
| Stage 2- Growth | | |
| Cd growth precursor | Cd(Oleate)[mmol] | 23.07 |
| Se growth precursor | DIBP-Se in NDP [mmol] | 18.46 |
| CdSe Absorbance [nm] | 469 | |
| CdSe Output [mmol Cd] | 42.48 | |
| % Yield | 92.5% | |

EXAMPLE VI

Semiconductor Nanocrystals Capable of Emitting Green Light

EXAMPLE VIA

Figure 4A:
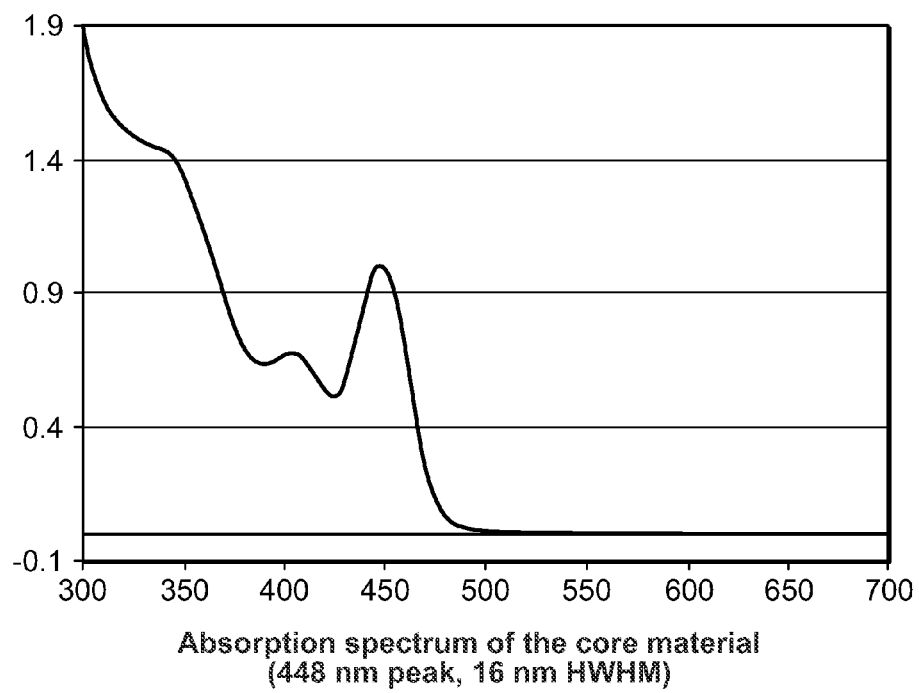
FIG. 4A graphically illustrates the Absorption spectrum referred to in Example VIA.

Synthesis of CdSe Cores (448 mm Target):

The following are added to a 1 L steel reaction vessel: trioctylphosphine oxide (51.88 g), 1-octadecene (168.46 g), 1-octadecylphosphonic acid (33.09 g, 98.92 mmol), and Cd(Oleate)$_2$ (1M solution in trioctylphosphine, 98.92 mL, 98.92 mmol). The vessel is subjected to 3 cycles of vacuum/nitrogen at 120° C., and the temperature is raised to 270° C. under nitrogen. At 270° C., a solution of 1M diisobutylphosphine selenide in N-dodecylpyrrolidone (DIBP-Se, 77.16 mL, 77.16 mmol) is rapidly injected, within a period of less than 1 second, followed by injection of 1-octadecene (63.5 mL) to rapidly drop the temperature to about 240° C. resulting in the production of quantum dots with an initial absorbance peak between 420-430 nm. 5-20 seconds after the ODE injection, a solution of Cd(Oleate)$_2$ (0.5M in a 50/50 v/v mixture of TOP and ODE) is continuously introduced along with a solution of DIBP-Se (0.4M in a 60/40 v/v mixture of N-dodecylpyrrolidone and ODE) at a rate of 29.0 mL/min. A total of 74.25 mL of each precursor is delivered while the temperature of the reactor is maintained between 205-240° C. At the end of the infusion, the reaction vessel is cooled rapidly by immersing the reactor in a squalane bath chilled with liquid nitrogen to rapidly bring the temperature down to <150° C. (within 2 minutes). The final material is used as is without further purification (First absorbance peak: 448 nm, Total volume: 702 mL, Reaction yield: 99%). The absorption spectrum of the core is shown in FIG. 4A.

EXAMPLE VIB

Figure 4B:
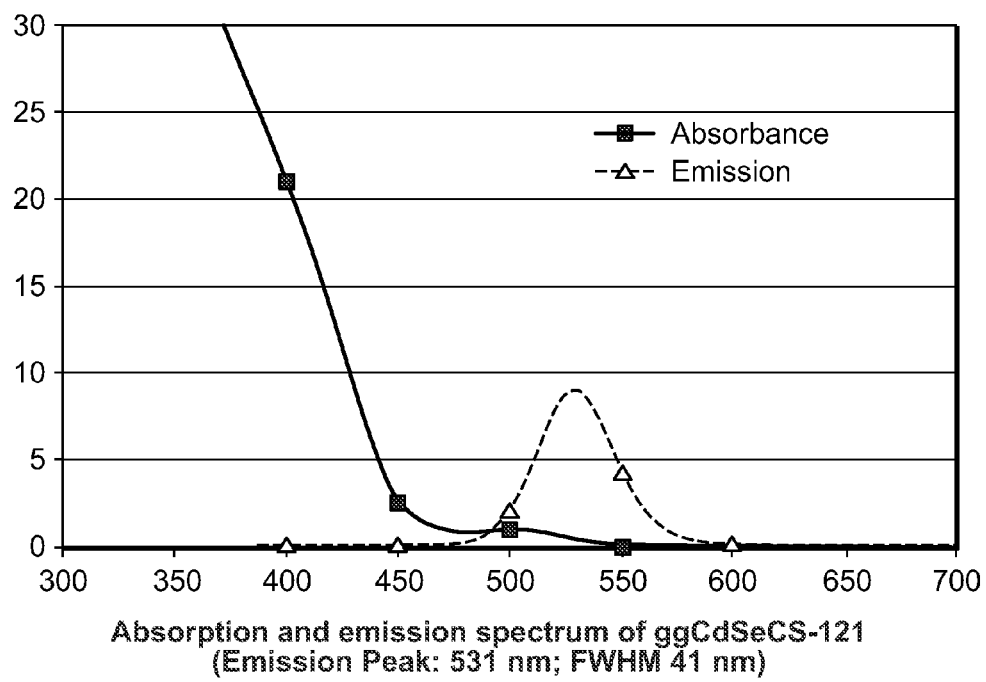
FIG. 4B graphically illustrates the absorption and emission spectra referred to in Example VIB.

Synthesis of CdSe/ZnS/CdZnS Core/Shell/Shell:

CdSe cores synthesized as described in the preceding paragraph, with a first absorbance peak of 448 nm (27.70 mL, 4.78 mmol Cd), are mixed with dodecanethiol (23.76 mL, 99.20 mmol) in a syringe. A reaction flask containing Zn(Oleate)$_2$ (99.20 mL, 0.5M in TOP) is heated to 300° C., upon which the syringe containing cores and 1-dodecanethiol is swiftly injected. When the temperature recovers to 310° C. (between 2-8 minutes (min)), the overcoat precursors are delivered via a syringe pump over a period of 32 min. The two overcoating precursor stocks include the following: 1) Zn(Oleate)$_2$ (141.25 mL, 0.5M in TOP, 70.63 mmol) mixed with Cd(Oleate)$_2$ (79.64 mL, 1.0M in TOP, 79.64 mmol), and 2) dodecanethiol (39.59 mL, 165.29 mmol) mixed 1-octadecene (3.67 mL) and n-trioctylphosphine (0.92 mL). During the overcoating precursor infusion, the temperature is kept between 320-330° C. Any volatiles from the system are allowed to distill over and leave the system in order for the temperature to reach 320-330° C. After the infusion ends, the sample is annealed for 3 minutes at 320-330° C. and cooled to room temperature over a period of 5-15 minutes. The final core/shell material is precipitated via the addition of butanol and methanol at a 2:1 ratio v/v. The pellet is isolated via centrifugation, and redispersed into toluene for storage (Emission 531 nm, FWHM 41 nm, Film EQE at RT: 99%, Film EQE at 140° C.: >90%). The absorption and emission spectra of the resulting overcoated nanocrystals are shown in FIG. 4B.

EXAMPLE VII

Semiconductor Nanocrystals Capable of Emitting Red Light

EXAMPLE VIIA

Figure 5A:
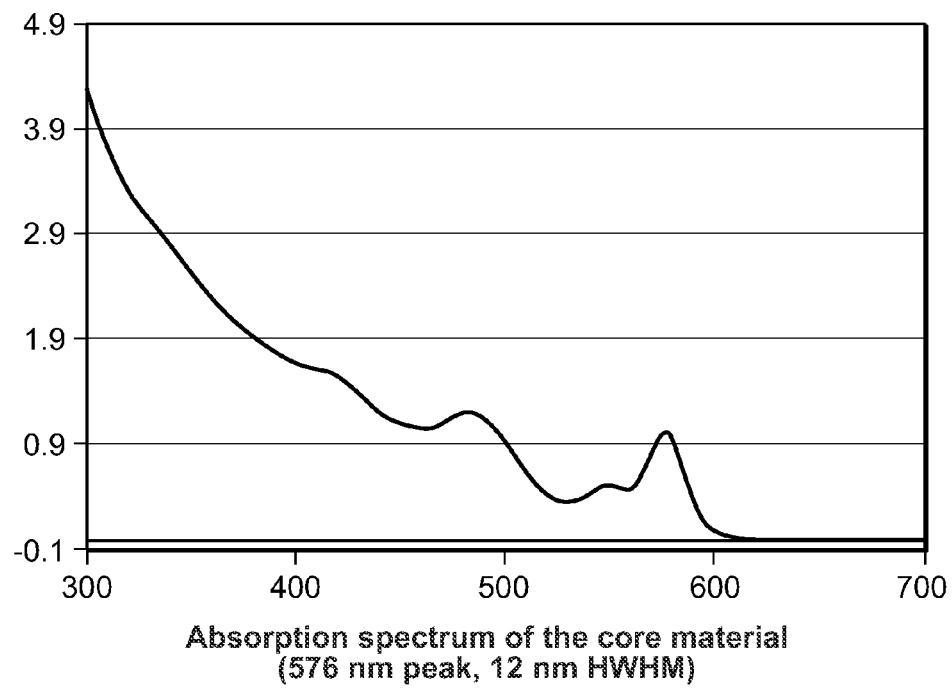
FIG. 5A graphically illustrates the Absorption spectrum referred to in Example VIIA.

Synthesis of CdSe Cores:

The following are added to a 1 L glass reaction vessel: trioctylphosphine oxide (15.42 g), 1-octadecene (ODE, 225.84 g), 1-octadecylphosphonic acid (1.88 g, 5.63 mmol). The vessel is subjected to 3 cycles of vacuum/nitrogen at 120° C., and the temperature is raised to 270° C. under nitrogen. At 270° C., solutions of 0.25M diisobutylphosphine selenide in N-dodecylpyrrolidone (DIBP-Se, 17.55 mL, 4.3 8 mmol) and 0.25M Cd(Oleate)$_2$ in trioctylphosphine/ODE (22.50 mL, 5.62 mmol) are rapidly injected, within a period of less than 1 second, followed by injection of ODE (76.0 mL) to rapidly drop the temperature to about 240° C., resulting in the production of quantum dots with an initial absorbance peak between 420-450 nm, 5-20 seconds after the ODE quench, a solution of Cd(Oleate)$_2$ (0.5M in a 50/50 v/v mixture of TOP and ODE) is continuously introduced along with a solution of DIBP-Se (0.4M in a 60/40 v/v mixture of N-dodecylpyrrolidone and ODE) at a rate of 55.7 mL/hr. At 15 min, the infusion rate is increased to 111.4 mL/hr. At 25 min, the infusion rate is increased to 167.1 mL/hour. At 35 min, the infusion rate is increased to 222.8 mL/hr. At 45 min, the infusion rate is increased to 297.0 mL/hr. At 55 min, the infusion rate is increased to 396.0 mL/hr. A total of 149.7 mL of each precursor is delivered while the temperature of the reactor is maintained between 215-240° C. At the end of the infusion, the reaction vessel is cooled using room temperature airflow over a period of 5-15 min. The final material is used as is without further purification (First absorbance peak: 576 nm, total volume: 736.5 mL, Reaction yield: 99%). The absorption spectrum of the core is shown in FIG. 5A.

EXAMPLE VIIB

Figure 5B:
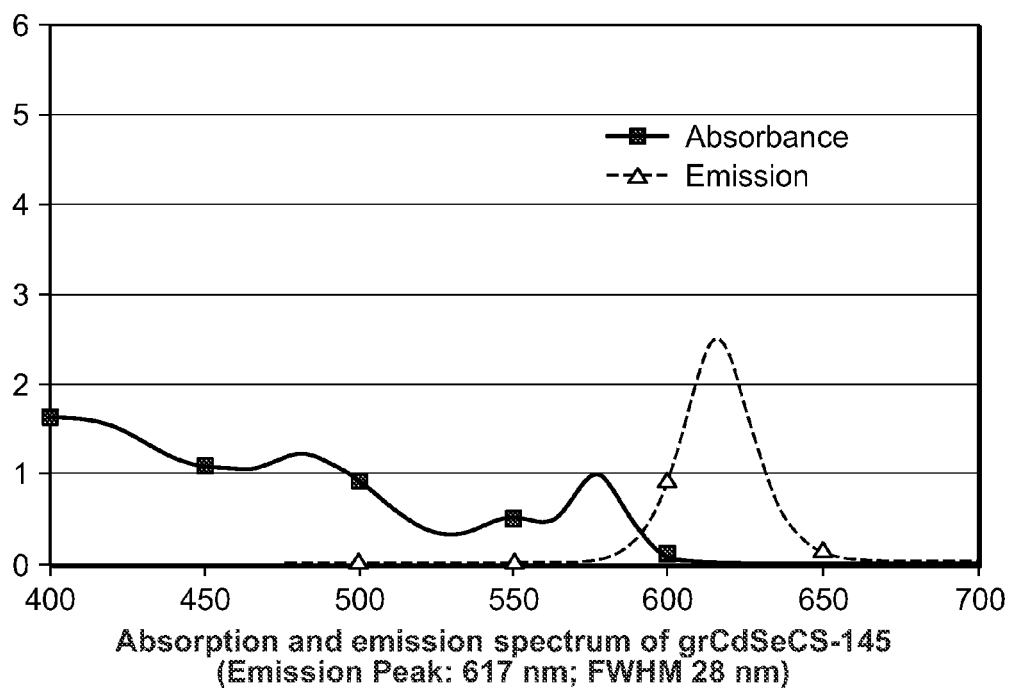
FIG. 5B graphically illustrates the absorption and emission spectra referred to in Example VIIB.

Synthesis of CdSe/ZnS/CdZnS Core/Shell/Shell:

CdSe cores synthesized as described in the preceding paragraph, with a first absorbance peak of 576 nm (90.10 mL, 8.70 mmol Cd), are mixed with Zn(Oleate)$_2$ (47.62 mL, 0.5M in TOP, 23.81 mmol). The solution is heated to 320° C., upon which a syringe containing 1-dodecanethiol (8.55 mL, 35.7 mmol) is swiftly injected. After 10 min of annealing between 305-325° C., the overcoat precursors are delivered via a syringe pump over a period of 30 min. The two overcoating precursor stocks include the following: 1) Zn(Oleate)$_2$ (89.73 mL, 0.5M in TOP, 44.87 mmol) mixed with Cd(Oleate)$_2$ (104.68 mL, 1.0M in TOP, 104.68 mmol), and 2) dodecanethiol (70.59 mL, 294.70 mmol) mixed with 1-octadecene (21.29 mL) and TOP (5.32 mL). During the overcoating precursor infusion, the temperature is kept between 320-330° C. Any volatiles from the system are allowed to distill over and leave the system in order for the temperature to reach 320-330° C. After the infusion ends, the sample is annealed for 5 min at 320-330° C. and cooled to room temperature over a period of 5-15 min. The final core/shell material is precipitated via the addition of butanol and methanol at a 2:1 ratio v/v. The pellet is isolated via centrifugation, and redispersed into toluene (200 mL) for storage (Emission 617 nm, FWHM 30 nm, Film EQE at RT: 92%, Film EQE at 140° C.; 75-80%). The absorption and emission spectra of the resulting overcoated nanocrystals are shown in FIG. 5B.

"Solid state external quantum efficiency" (also referred to herein as "EQE" or "solid state photoluminescent efficiency) can be measured in a 12" integrating sphere using a NIST traceable calibrated light source, using the method developed by Mello et al., Advanced Materials 9(3):230 (1997), which is hereby incorporated by reference. Such measurements can also be made with a QEMS from LabSphere (which utilizes a 4 in sphere; e.g. QEMS-2000: World Wide Website laser2000.nl/upload/documenten/fop_21-en2.pdf).

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for making quantum dots comprising:
    combining one or more highly reactive chalcogenide precursors comprising a secondary phosphine chalcogenide, one or more highly reactive metal precursors comprising a metal carboxylate, a solvent, and a seed stabilizing agent comprising a phosphonic acid at a reaction temperature above about 200° C. to form a reaction mixture where the ratio of metal to chalcogenide is in a range from about 1:1 to about 1:0.5, wherein the solvent and the seed stabilizing agent are not the same, and
    quenching the reaction mixture after nucleation by cooling the reaction mixture to a quenching temperature that is lower than the reaction temperature, resulting in seed quantum dots, and
    adding additional stoichiometric amounts of the highly reactive secondary phosphine chalcogenide precursor comprising a secondary phosphine chalcogenide and the highly reactive metal precursor comprising a metal carboxylate to the quenched reaction mixture including the seed quantum dots under conditions suitable to increase the size of the seed quantum dots to a desired size.

2. A method in accordance with claim 1 wherein a metal precursor comprises cadmium oleate (Cd(Oleate)$_2$).

3. A method m accordance with claim 1 wherein the seed stabilizing agent is octadecylphosphonic acid.

4. A method in accordance with claim 1 wherein the reaction temperature is sufficient to form the quantum dots.

5. A method in accordance with claim 1 wherein quenching comprises dropping the temperature to a temperature sufficiently low to prevent nucleation and Ostwald ripening.

6. A method in accordance with claim 1 wherein quenching comprises dropping the temperature to a temperature sufficiently low to prevent nucleation and Ostwald ripening, but is sufficiently high for a subsequent growth of the quantum dot.

7. A method in accordance with claim 1 wherein the seed quantum dots comprise CdSe and the reaction temperature is about 270° C.

8. A method in accordance with claim 1 wherein the step of quenching the reaction mixture is accomplished by rapid addition of a non-coordinating solvent to the reaction mixture sufficient to lower the reaction mixture temperature to the quenching temperature.

9. A method in accordance with claim 8 wherein the non-coordinating solvent is 1-octadecene.

10. A method in accordance with claim 7 wherein the quenching temperature is in a range from about 200 to about 240° C.

11. A method in accordance with claim 1 wherein the quantum dots are increased to a desired size at which the reaction mixture lacks unreacted metal precursor and unreacted secondary phosphine chalcogenide precursor.

12. A method according to claim 11 wherein the quantum dots of desired size are removed from the reaction mixture without purification and are then overcoated with a coating.

13. A method in accordance with claim 12 wherein the coating comprises one or more semiconductor materials, at least one of which is different from the composition of the quantum dot being coated.

14. A method in accordance with claim 12 wherein the quantum dots of desired size are overcoated without purification in the reaction mixture with a coating comprising one or more semiconductor materials.

15. A method in accordance with claim 12 wherein the coating comprises two or more layers.

16. A method in accordance with claim 1 wherein the additional amounts of the metal precursor and the secondary phosphine chalcogenide precursor are provided to a reaction vessel including the quantum dots as a substantially steady or substantially constant infusion such that as metal and chalcogenide precursors are consumed or otherwise used to grow the quantum dots, additional supply of metal and chalcogenide precursors are provided to the reaction vessel to continue growth of the quantum dots until a desired quantum dot size is reached.

\* \* \* \* \*